United States Patent
Kato et al.

(10) Patent No.: US 6,457,877 B2
(45) Date of Patent: *Oct. 1, 2002

(54) OPTICAL MODULE, METHOD FOR MANUFACTURING OPTICAL MODULE AND OPTICAL COMMUNICATION APPARATUS

(75) Inventors: Takeshil Kato, Akishima (JP); Koji Yoshida, Kokubunji (JP); Toshinori Hirataka, Yokohama (JP); Toshiaki Ishii, Hitachi (JP); Kazuyuki Fukuda, Fujisawa (JP); Tadaaki Ishikawa, Tsutiura (JP); Toshimasa Miura, Fujisawa (JP); Tsutomu Kono, Kawasaki (JP); Kimio Tatsuno, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/788,341

(22) Filed: Feb. 21, 2001

Related U.S. Application Data

(63) Continuation of application No. 09/480,478, filed on Jan. 11, 2000, now Pat. No. 6,220,764, which is a continuation of application No. 09/402,585, filed as application No. PCT/JP98/01430 on Mar. 30, 1998, now Pat. No. 6,282,352.

(30) Foreign Application Priority Data

Apr. 8, 1997 (JP) .............................................. 9-089490

(51) Int. Cl.⁷ ................................................. G02B 6/42
(52) U.S. Cl. .............................. 385/92; 385/88; 385/94
(58) Field of Search ............................. 385/88, 92, 94; 264/1.25

(56) References Cited

U.S. PATENT DOCUMENTS 4,410,469 A  10/1983  Katagiri et al. .............. 264/1.5

(List continued on next page.)

FOREIGN PATENT DOCUMENTS

| JP | 1-304405 | 12/1989 |
|---|---|---|
| JP | 2-271308 | 11/1990 |
| JP | 3-17605 | 1/1991 |
| JP | 7-35954 | 2/1995 |
| JP | 7-321407 | 12/1995 |
| JP | 8-15576 | 1/1996 |
| JP | 8-248274 | 9/1996 |

OTHER PUBLICATIONS

Proceedings of the Conference of the Institute of Electronics, Information, and Communication Engineers, 1996, vol. 1, SC-3-14, pp. 478-479.

(List continued on next page.)

*Primary Examiner*—John D. Lee
*Assistant Examiner*—Sarah U Song
(74) *Attorney, Agent, or Firm*—Mattingly, Stanger & Malur, P.C.

(57) ABSTRACT

An optical module for an optical device and an optical fiber is constituted by a pre-molded plastic package. In forming the plastic package, the main flowing direction of the molding resin is substantially parallel with the optical axis of the optical fiber. The optical module is formed by molding the resin by an injection method using pressure and then solidifying the resin. When the plastic package is formed by comprehensive molding, the flowing direction of the resin is parallel with the optical axis direction of the optical fiber to be installed in the optical module. As a result, for comprehensive molding, the molding pressure applied to the optical fiber is reduced. By using the resin case that is formed, the resulting package exhibits high rigidity and low thermal expansion properties in connection with the flowing direction of the resin, thus reducing the external stress and thermal stress applied to the optical fiber.

9 Claims, 12 Drawing Sheets

U.S. PATENT DOCUMENTS

| | | | | |
|---|---|---|---|---|
| 4,466,009 | A | | 8/1984 | Konishi et al. ............... 357/30 |
| 4,756,592 | A | | 7/1988 | Sasayama et al. ............ 385/88 |
| 5,013,495 | A | | 5/1991 | Noba et al. .................. 264/1.5 |
| 5,684,903 | A | | 11/1997 | Kyomasu et al. ............. 385/93 |
| 5,727,105 | A | * | 3/1998 | Nagata et al. ................ 385/88 |
| 5,737,467 | A | | 4/1998 | Kato et al. .................... 385/92 |
| 6,170,996 | B1 | * | 1/2001 | Miura et al. .................. 385/88 |
| 6,220,764 | B1 | * | 4/2001 | Kato et al. .................... 385/92 |
| 6,282,350 | B1 | * | 8/2001 | Takahashi et al. ............ 385/33 |
| 6,282,352 | B1 | * | 8/2001 | Kato et al. ................. 264/1.25 |

OTHER PUBLICATIONS

Proceedings of the Conference of the Institute of Electronics, Information, and Communication Engineers in 1996, vol. 1, C–216, p. 216.

Proceedings of the Conference of the Insitute of Electronics, Information and Communication Engineers, 1996, voo.l 1, C–207, p. 207.

Robertson, Michael J., et al, "The Expanded Mode Laser–A Route to Low Cost Optoelectronics," IEICE Trans. Electron, vol. E80–C, No. 1, Jan. 1997, pp. 17–23.

Collins, J.V., et al, "Laser Diode Chip and Packaging Technology," Proceedings, SPIE, vol. 2610, pp. 108–116. (No Date).

Hall, I.P., "Novel Techniques for Low–Cost, High Performance Optoelectronic Component Assembly," 9th European Hybrid Microelectronics Conference, Nice, France, Jun. 1993, pp. 44–47.

Hall, I.P., "Non–hermetic Encapsulation and Assembly Techniques for Optoelectronic Applications," 10th European Microelectronics Conference, May 14–17, 1995, Copenhagen, Denmark.

* cited by examiner

US 6,457,877 B2

OPTICAL MODULE, METHOD FOR MANUFACTURING OPTICAL MODULE AND OPTICAL COMMUNICATION APPARATUS

This is a continuation application of U.S. Ser. No. 09/480,478, filed Jan. 11, 2000 now U.S. Pat. No. 6,220,764, which is a continuation application of U.S. Ser. No. 09/402,585, filed Oct. 7, 1999 now U.S. Pat. No. 6,282,352, which is a 371 of PCT/JP98/01430 filed Mar. 30, 1998.

TECHNICAL FIELD

The present invention relates to a resin molding type optical module having an optical device and an optical fiber packaged with a resin, an optical fiber communication apparatus using the resin molding type optical module, and an optical communication system.

BACKGROUND ART

Recently, great demands for lowering the cost of the optical module have been made in order to introduce the optical fiber communication system into the subscriber network system on a full scale. From a viewpoint of this, with respect to the packaging technology, a resin sealing method (a plastic package method) is influential in place of a hermetic sealing method for a metallized package or a ceramic package which has heretofore occupied the mainstream in the field of optical devices. This is because the resin sealing method is suitable for mass- and inexpensive production.

In the past, in the field of general semiconductor devices such as LSI and hybrid IC, the following various methods have been known as resin sealing methods. (1) a transfer molding method (a method for compressing preheated powdery resin to transfer it to a mold), (2) a casting injection method (method for injecting a liquid resin into a mold frame), (3) a potting injection method (a method for injecting a liquid resin into a resin case), (4) a cap sealing method (a method for adhering a cap to a hollow case with resin), (5) a dipping method (a method for dipping an element into a resin liquid vessel), and (6) a dropping method (a method for dropping a liquid resin onto an element).

Further, the following examples in which the aforementioned resin sealing methods are applied to the optical module have been known. For example, there are Japanese Patent Application Laid-Open No. 2-271308 (Article 1), Japanese Patent Application Laid-Open No. 1-304405 (Article 2), Japanese Patent Application Laid-Open No. 7-321407 (Article 3), Proceedings of the Conference of the Institute of Electronics, Information and Communication Engineers in 1996, Separate Volume—Electronics 1, pages 478 to 479 (Article 4), the same collection, page 216 (Article 5), and the same collection, page 207 (Article 6).

Article 1: In the receptacle type optical module for fiber optic transmission, a hermetic seal by way of a metallized package and a resin seal by way of transfer molding are jointly used. A laser diode and a photodiode are once hermetically sealed in a can type metallized package, and the can type metallized package is molded by the transfer molding method together with electronic circuit parts and a lead frame.

Article 2: In the receptacle type module, a potting injection type method is used. A resin case comprises a black epoxy resin molded article. A cylindrical receptacle is provided in part thereof. A light emitting diode and a light receiving diode are installed on a lead frame, and are received in the resin case. The resin case are filled with transparent epoxy resins by potting. The light emitting diode or the light receiving diode is directly sealed by the transparent resin.

Article 3: This is concerned with a pickup light source of an optical disk. In this example, a casting injection method (or a transfer molding method) and a resin sealing method by way of a dropping method are jointly used. The laser diode is fixedly secured to the lead frame through a heat sink, and these are sealed by casting of transparent epoxy resins. A silicone resin is coated on the surface of the laser diode by the dropping method in order to prevent the optical damage of the sealed resin caused by emitting light of laser and the peeling of an interface between the laser diode and the sealed resin.

Article 4: In the pigtail type module for fiber optic transmission, a casting injection method is employed. In this example, the laser diode and the bare portion of the pigtail fiber are sealed with resin. That is, the laser diode and the extreme end of the bare fiber are secured to the heat sink, and the heat sink is fixedly secured to the metallic stem. They are molded by casting of transparent epoxy resins. The jacket portion of the pigtail fiber is not sealed with resin.

Article 5: In the pigtail type module, a hollow resin case is closed by a cap sealing method. The laser diode and the bare portion of the pigtail fibers are secured to a silicon base plate, and the base plate and the jacket portion are secured to the resin case. A lead frame is insert-molded in the resin case. The bare fiber and the base plate, the jacket and the resin case, and the cap and the resin case are bonded one another by ultraviolet setting resins.

Article 6: In the receptacle type module, the cap sealing method and the transfer molding method are jointly used. A laser diode, the extreme end of a ferrule with fiber, and a lead frame are secured to a silicon substrate to constitute a substrate assembly. The laser diode and the ferrule are once sealed by adhering a silicon cap on the substrate with the epoxy resin, and the substrate assembly is sealed by the transfer molding of black epoxy resins except the rear end of the ferrule and the outer lead portion of the lead frame. The receptacle is constituted by a part of the transfer molded article, the rear end of the ferrule and a housing provided by other parts.

The plastic package is influential for lowering the cost of the optical module as compared with the metallized package or the ceramic package, but has difficulties such that generally, the moisture permeability is high, and the coefficient of thermal expansion is large. These factors synthetically lower the reliability of the plastic package. It is therefore important, for putting the plastic module in practical use, how to secure the reliability while making use of the merit of lowering the cost of the plastic package.

It is concretely necessary to make consideration relative to the aforementioned problems from the following two aspects. First, the moisture resistance should be increased in respect of constituent parts of the module such as an optical device, an optical fiber, a base plate and so on. Secondly, with respect to the optical coupling between the optical device and the optical fiber, it is necessary to suppress extremely highly a deviation in position caused by the thermal stress, the external force, the molding pressure, etc. In particular, in the semiconductor laser module, a demand relative to such a position is severe. This is because the spot size of the laser diode is smaller than the spot size of the light emitting diode and the light receiving diameter of the photodiode.

Any of the aforementioned prior arts have both merits and demerits with respect to such demands as noted above, and fail to respond to the demands of the current industrial world. The present invention is a new invention in connection with these various matters. The aforementioned problems with respect to the prior arts will be briefly mentioned in order to better understand the background of the present invention.

Article 1: The number of parts and the number of assembly steps so increase as not to make a good use of the plastic package, i.e., the low cost. That is why the metallized package and the plastic package are jointly used.

Article 2: The cylindrical receptacle is formed in a part of the resin case. Considering the dimensional accuracy of the receptacle itself and the deformation of the receptacle caused by the insert- and pull force of connector and the thermal expansion, the module in Article 2 can be applied to a light emitting diode having a large pot size but is not suitable for a laser diode having a small spot size.

Article 3: A light source for an optical disk is concerned, which is not used for transmission of an optical fiber as in the present invention. Naturally, consideration of the seal of fiber and the reliance of optical coupling is not taken in Article 3.

Article 4: Only the bare portion of the pigtail fiber is sealed with resin, and the jacket portion is exposed to outside. Accordingly, the thermal stress and the external force are concentrated on the interface between the bare fiber portion and the jacket portion to bring forth a problem in that the bare fiber is broken. There is a difficulty that since when the casting is performed, voids tend to be mixed, water moves in from the channel to corrode optical ends of optical devices and electrodes.

Article 5: While the pigtail fiber is received in the hollow resin case, reference is not made to the thermal stress and moisture resistance of the resin case. Further, reference is not made to materials for the resin case and molding method. In this technique, various problems occurs unless various items mentioned above are sufficiently selected. That is, due to a difference in the coefficient of thermal expansion between the bare fiber (quartz glass) and the resin case, the bare fiber protrudes from the jacket, and the crack occurs in the bare fiber due to the concentration of stress. Further, vapor permeated into the hollow case becomes dewed on the surface of the optical device or the bare fiber to give rise to the corrosion of the optical device, or to progress the growth of crack, resulting in the rupture of the bare fiber.

Article 6: The optical device and the ferrule with fiber are sandwiched between the silicon substrate and the silicone cap, and sealed. However, the elastic modulus of the resin package member and the anisotropy of the thermal coefficient of expansion of the resin package member are not taken into consideration.

As briefly mentioned above, the prior arts lack some consideration in relation to the number of parts, thermal stress and moisture resistance concerned with the cost. The present invention provides an optical module compatible with the lower cost and the higher reliance by the plastic packaging technique.

DISCLOSURE OF INVENTION

A first object of the present invention is to secure the reliability of an optical module while reducing the molding cost of a resin case type package.

A second object of the present invention is to secure the long-term stability of an optical coupling between an optical element and an optical fiber while reducing the molding cost of a resin case type package. That is, it is to provide a means which suppresses deformation of the resin case caused by the change in temperature and the external force to reduce stress applied to constituent members of the optical module.

A third object of the present invention is to provide a means for further enhancing the moisture resistance of constituent members of an optical module such as an optical device and an optical fiber while reducing the molding cost of a resin case type package. Thereby, the long-term stability of the optical module is to be secured. By the joint use with the means for securing the long-term stability of the optical coupling between the optical device and the optical fiber mentioned in the above second object, it is possible to secure more sufficient and long-term stability of the optical module.

A fourth object of the present invention is to secure the reliability of an optical module while reducing the molding cost of a comprehensive molding type package.

A fifth object of the present invention is to secure the long-term stability of an optical coupling between an optical device and an optical fiber while reducing the molding cost of a comprehensive molding type package. That is, it is to provide a means which suppresses deformation of the resin case caused by the change in temperature and the external force to reduce stress applied to constituent members of the optical module.

A sixth object of the present invention is to provide a means for further enhancing the moisture resistance of constituent members of an optical module such as an optical device and an optical fiber while reducing the molding cost of a comprehensive molding type package. Thereby, the long-term stability of the optical module is to be secured. By the joint use with the means for securing the long-term stability of the optical coupling between the optical device and the optical fiber mentioned in the above fifth object, it is possible to secure more sufficient and long-term stability of the optical module.

A seventh object of the present invention is to provide a means for constituting the optimal electric connection to an optical device while securing the reliability of an optical module and the reduction of the molding cost of a resin case type package.

An eighth object of the present invention is to provide a means for constituting the optimal electric connection to an optical device while securing the reliability of an optical module and the reduction of the molding cost of a comprehensive molding type package.

A ninth object of the present invention is to provide an optical communication apparatus having an optical module of low cost and high reliability mounted thereon, and an optical communication system.

Various inventions disclosed in the present specification particularly relate to the following two aspects in solving the aforementioned problems. The first is an aspect of a resin package molding method. The second is an aspect of a method for mounting an optical device and an optical fiber into the resin package. In the present specification, the resin package molding method is divided roughly, and the individual molding methods will be explained in detail.

The resin package molding method is divided roughly into two kinds. First, a method of using a resin case premolded (hereinafter referred to as a resin case type) is used. Secondly, a method for comprehensively insert-molding an optical device with other various constituent parts (hereinafter referred to as a comprehensive molding type method) is used. In the case of the above-described resin case type, an injection method is suitable for molding a resin case. On the other hand, in the comprehensive molding method, a transfer molding is suitable.

It is noted that the optical devices in the present specification include active optical devices such as a semiconductor laser device, an optical amplifier, an optical modulator, an optical switch, etc., passive optical elements such as a semiconductor light receiving device, an optical coupler, an optical wavelength multiplexer/demultiplexer, etc., a hybrid optical integrated circuit in which optical elements are mounted on an optical waveguide base plate or an electronic circuit base plate, a monolithic integrated optical circuit having optical elements and an electronic circuit integrated, and an optical element as fiber. Further, as the aforementioned various optical devices, a semiconductor device having an active region mainly formed of a semiconductor material, and a dielectric optical device having an active region formed of a dielectric material can be also used.

As optical fibers, there can be used, in addition to a single mode quartz fiber, a multimode fiber, a plastic fiber, and so on. Not only one but a plurality of optical fibers can be used. Forms of fibers include a form used as a fiber array and a fiber ribbon, and a form for removing or connecting fibers on some surfaces of the package.

In the following, with respect to the details of the present invention, a method of a resin case type will be first explained, and a comprehensive molding method will then be explained.

<Resin Case Type Molding Method>

Main forms of the present invention belonging to the resin case type are as listed below. It is noted that the contents of detailed explanation thereof, further improved inventions, and modified inventions will be also explained.

A first mode of the optical module according to the present invention has the following constitution. That is, there comprises an optical device, an optical fiber optically coupled to the optical device, and a resin case member for mounting at least the optical device and the optical fiber thereon, the direction along an optical axis of the optical fiber; being the direction of the high elastic modulus of a resin material of a main portion along the optical axis of the optical fiber of the resin case member.

Since the direction of the optical fiber is the direction of the high elastic modulus in the resin having the anisotropy in the elastic modulus particularly at the main portion along at least the optical axis of the optical fiber in the base of the resin case member, the deformation of the resin case due to the mechanical external force and the difference in the thermal expansion is suppressed. The resin case member is inexpensive as compared with the ceramic package, and the resin case is free from deformation whereby the manufacturing yield can be enhanced, and the manufacturing cost price can be reduced.

A second mode of the optical module according to the present invention comprises an optical device, an optical fiber optically coupled to the optical device, and a resin case member for mounting at least the optical device and the optical fiber thereon, the direction along an optical axis of the optical fiber being the direction of the low coefficient of thermal expansion in a resin material of a main portion at least along the optical axis of the optical fiber in the resin case member.

Since the direction along an optical axis of the optical fiber is the direction of the low coefficient of thermal expansion in a resin material at a main portion along the optical axis of the optical fiber in the resin case member, the deformation of the base due to the heat is small, and the misalignment for coupling between the optical device and the optical fiber does not occur. It is noted that the generation source of heat for occurrence of such a phenomenon as described in question is for example, a change in temperature of external environment or heat generation of the optical device itself in the package.

The resin case member is inexpensive as compared with the ceramic package, and the resin case is free from deformation whereby the manufacturing yield can be enhanced, and the manufacturing cost price can be reduced.

A third mode of the optical module according to the present invention comprises an optical device, an optical fiber optically coupled to the optical device, and a resin case member for mounting at least the optical device and the optical fiber thereon, the orientation of a molecular chain of the resin being substantially parallel with the optical axis of the optical fiber in a main portion along an optical axis of the optical fiber in the resin case member.

Since the orientation of a molecular chain of the resin of the main portion along the optical axis of the optical fiber being substantially parallel with the optical axis of the optical fiber, it is possible to enhance the elastic modulus of the case in the direction of orientation of the molecular chain and to reduce the coefficient of thermal expansion as a result. Accordingly, the deformation of the base due to the external stress or thermal stress is small, and the deviation in position between the optical device and the optical fiber does not occur. It is noted that the generation source of heat for occurrence of such a phenomenon as described in question is for example, a change in temperature of external environment or heat generation of the optical device itself in the package.

The resin case member is inexpensive as compared with the ceramic package, and the resin case is free from deformation whereby the manufacturing yield can be enhanced, and the manufacturing cost price can be reduced.

A fourth form of the optical module according to the present invention comprises an optical device, an optical fiber optically coupled to the optical device, and a resin case member for mounting at least the optical device and the optical fiber thereon and having a main flowing direction of the resin substantially parallel with the optical axis of the optical fiber.

According to the above-described molding method, the direction of the optical axis of the optical fiber is generally parallel with the orientation of the molecular chain of the resin constituting the lengthwise direction of the resin case. Therefore, it is possible to enhance the elastic modulus of the case in the direction of orientation of the molecular chain and to reduce the thermal expansion rate as a result.

Preferably, in molding the resin case as described, there is provided a gate for injecting the resin at a fiber supporting portion, a part in the vicinity thereof, or a part opposite to the supporting portion to inject the resin into a mold. By injecting the resin from the aforementioned part, it is possible to make the direction of the optical axis of the optical fiber and the orientation of the molecular chain of the resin constituting the lengthwise direction of the resin case generally parallel. This molding method is suitable to be used for (1) the pigtail type optical module and (2) the receptacle type optical module.

The resin case member according to the aforementioned molding method is inexpensive as compared with the ceramic package, and the resin case is free from deformation whereby the manufacturing yield can be enhanced, and the manufacturing cost price can be reduced.

In this case, more practically, it is preferable that a lead frame is premolded integrally with a resin package member.

That is, when the resin is caused to flow substantially parallely with the optical axis of the optical fiber to mold the resin package member, the lead frame is inserted in advance at a predetermined position, and a thermoplastic resin is caused to flow for injection molding.

According to this means, since the resin case and the lead frame as an electric terminal can be integrated and supplied, the handling in assembly of the module is simple. Further, since the optical device and the optical fiber can be firmly located to the substrate, optical coupling can be stabilized without disturbing alignment between the optical device and the fiber by the distortion of the case caused by the external force or the change in temperature. Furthermore, heat generated by the optical device is released through the lead frame.

In the case where the optical module is produced using the resin case type, it is important, from a viewpoint of an idea of the method for molding the resin package, when the resin case is injection-molded, to place the optical fiber in the resin case so that the flowing direction of the thermoplastic resin within the mold is generally parallel with the direction of the optical axis of the optical fiber. When various members are sealed in the case, it is possible to suppress the deformation of the case caused by the external force or the change in temperature, and suppress the deformation of the case caused by the change in temperature or the external pressure. Because of this, it is possible to prevent an occurrence of deterioration in optical coupling characteristics caused by the positional deviation between the optical device and the fiber, and cracks in the fiber surface, as a consequence of which the reliability of the optical module can be enhanced. The optical coupling between the optical device and the fiber can be maintained stable for a long period of time.

There are two kinds of case materials for the resin case type, which are a thermosetting resin and a thermoplastic resin. A typical example of the thermosetting resin that can be mentioned is an epoxy resin. Examples of the thermoplastic resins that can be mentioned include a liquid crystal polymer (LCP) of a glass fiber-reinforced grade, a cross-linked type polyphenylene sulfide (PPS) resin, a linear PPS resin, a polybutylene terephthalate (PBT) resin and so on of a filler-reinforced grade and a carbon fiber-reinforced grade.

As the resin used for the resin case method, the thermoplastic resin is particularly preferable. Because the thermoplastic resin has the advantages as follows: (1) The molding cycle time is short as compared with the thermosetting resin. (2) The resin loss ratio is low. (3) Recycle materials can be used. That is, together with the merit of the above (1), since the using quantity of resins can be reduced, it is useful for reducing the cost. (4) Burr is small due to the low pressure injection molding. (5) The cure after molding is unnecessary. On the basis of these advantages, it is possible to produce the resin case at lower cost. It is noted that the fact that a molding temperature is relatively high poses little problem in production of the resin case.

Further, it is possible to easily arrange the orientation of the molecular chain by carrying out the injection molding with the resin mentioned above. Particularly, it is possible to more easily arrange the orientation of the molecular chain with a linear PPS or a liquid crystal polymer. Accordingly, it is possible to realize lower stress by placing the fiber within the case along the aforementioned orientation to achieve the higher reliability as a result. Since the thermoplastic resin allows the molecular chain to be oriented in the flowing direction of resin when molding as described above, it is important to take into mechanical and thermal anisotropy. Deformation tends to occur relative to external force, or time passage positional deviation (creep) between the optical device and the fiber or crack in fiber due to the thermal stress sometimes is induced unless the dependency of elastic modulus or coefficiency of thermal expansion is taken into consideration.

It is noted that the thermosetting resin can be also used for the present method of resin case type. However, the use of the thermoplastic resin is advantageous in terms of price as compared with the use of the thermosetting resin.

Next, the sealing of the optical device and the optical fiber within the resin package in the case of the resin case type will be explained.

In the case of the resin case type, the procedure itself of the manufacturing method may employ the usual procedure. At least the optical device and the optical fiber are placed on the base of the resin package, and the package is completed using the cap. More practically, the substrate having the optical device and the optical fiber secured thereto is placed on the resin case in which the lead frame is inserted except the outer lead portion and subjected to injection molding.

In the resin case type, the sealing method for the optical device and the optical fiber within the package can be mainly classified into three kinds. A first method comprises a method for filling a transparent resin into a resin case by a potting injection method, a second method comprises a method for mounting a cap on a resin case to seal the interior of the case leaving to be hollow, and a third method comprises a method for sealing a resin case and a cap after a transparent resin has been dropped onto an optical device and a fiber. Of these methods, the first method, i.e., the potting injection method is more preferable.

The second method has a problem of the dewing to the optical device and the fiber, and the deterioration of the optical device and the rupture of the fiber resulting therefrom. As compared with the first and third methods, the first method, i.e., the potting injection method in which the case is internally filled with resin is more preferable in order to suppress the deformation of the resin case and the stress of the fiber as less as possible. In this case, the optical device and the optical fiber are coated directly with the transparent resin.

According to this means, the optical device and the optical fiber are coated directly with the transparent resin whereby water moved into the resin case (which cannot be avoided under the high temperature and high humidity environment for a long period of time) can be prevented from moistening to the optical surface of the optical device and the surfaces of the electrode and the fiber.

Further, the joint use of the sealing method for the optical device and the optical fiber within the package and the molding method for various resin package members according to the present inventions can obtain the following effects. That is, together with the effect of the lower stress based on the molding method for the resin package member, the adhesion of the transparent resin to the optical device and the optical fiber can be secured. The stress of the optical device itself is relieved because the resin case has the high elasticity and lower thermal expansion, and the adhesion of the transparent resin to the optical element and the optical fiber and the transparent resin can be secured. Accordingly, there is the effect that the corrosion of the optical device and the crack of the fiber caused by formation of a water film can be prevented, and the moisture resistance can be enhanced.

Further, the change in temperature of the external environment is relieved within the resin case. Furthermore, the enhancement of the environment resistance by the transparent resin used to seal the optical fiber is remarkable.

The transparent resins for directly coating the optical device and the fiber that can be used include thermosetting resins, for example, such as a silicone gel of a silicone resin, silicone rubber, a low stress epoxy resin, an acrylic resin, a urethane resin, etc.

It is noted that the laser diode for the optical disk mentioned in Article 3 in the column of the prior art is coated directly with the silicone resin as measures for optical damage. However, since the laser diode for fiber optic transmission has long in oscillation wavelength and emits relatively smaller optical output, the optical damage caused by absorption of light and thermal decomposition as in the optical disk is hard to occur. Accordingly, in the optical transmission system, it is less necessary to expect for the packaging resin the role as measures for optical damage as in Article 3. Article 3 is different from the present invention in a viewpoint of such a selection.

<Comprehensive Molding Method>

In the following, the comprehensive molding method will be explained.

The optical module in the fifth mode of the present invention according to the comprehensive molding method has the following constitution. That is, when the optical device and the optical fiber are inserted for transfer molding, the thermosetting resin is flown so as to be generally parallel with the direction of the optical axis of the optical fiber within the mold for molding. This method can reduce the flew resistance of the resin applied the fiber, and reduce the positional deviation and the residual distortion of the fiber. Accordingly, it is possible to prevent the deterioration of the optical coupling characteristic caused by the positional deviation between the optical device and the fiber and the occurrence of the crack in the fiber surface, thus enabling enhancement of the reliability of the optical module as a result.

Further, the present means has the effect that the optical device and the optical fiber can be molded stably and comprehensively in a short period of time by the transfer molding, and the cost can be reduced. Further, the molten thermosetting resin is flown along the fiber placed within the mold whereby fluctuation of the optical coupling characteristic during molding can be suppressed (for example, the low viscosity resin and the low speed molding are further effective), and the residual stress applied to the fiber after molding can be reduced. For example, the low elastic resin and the low thermal expansion resin are further effective. With this, the reliability of the optical module including the moisture resistance can be enhanced.

It is noted that when in molding, for example, the use of the low viscosity resin and the low speed molding are further effective in order to display the effects of the present invention. For solving the problem after molding, the use of, for example, the low elastic resin and the low thermal expansion resin is further effective.

As the resin used for the comprehensive molding method, the thermosetting resin is preferable. The typical examples of the base resin that can be listed include an epoxy resin and a silicone resin. Of course, a filler and a elasticizer as desired can be added similar to the case of the practical use of the usual thermosetting resin.

The comprehensive molding generally includes two methods, which are a casting injection method and a transfer molding method. For the former, mainly a liquid epoxy resin is used, and for the latter, mainly a tablet is used in which a powdery epoxy resin is pressed.

The transfer molding method is suitable for the lower cost and mass production. Because the transfer molding method has the following advantages as compared with the casting injection method. That is, (1) the molding time is short, (2) the vacuum defoaming process is unnecessary, and (3) the shape dimension and reliability are stable.

However, in the transfer molding in the case where there are no metallized package and cap, the transfer pressure of resin is applied to the optical device and the fiber, resulting in the positional deviation between the optical device and the fiber, and the distortion of the fiber and the optical device-mounted base plate. Accordingly, it is necessary to take the flowing direction of resin during molding into consideration. This positional deviation deteriorates the coupling characteristic of the optical device and the fiber. Further, since the distortion acts as the internal residual stress, this influences on the long-term reliability of the optical module.

It is noted that even in the resin case type, the orientation of the molecular chain by the flowing direction comprises a main point, and it is understood that the flowing direction is important for both the resin case type and the comprehensive molding type.

In this case, in the case of the transfer molding, it is suitable that the lead frame is inserted in advance into a predetermined position, and the thermosetting resin is flown generally parallel with the optical axis of the optical fiber to effect the transfer molding.

According to this means, the optical device and the optical fiber can be stable held on the base plate, and in addition, the base plate is fixed upwardly or downwardly of the lead frame and the transfer molding is performed to enable electric connection simply.

The sealing method for the optical device and the fiber in the comprehensive molding type can be mainly classified into four methods as follows: A first method is a method for directly molding an optical device or an optical fiber with a transparent resin, a second method is a method for molding an optical device or a fiber with an opaque resin (colored, mainly black) after being sealed with a cap, a third method is a method for molding them using a transparent resin after dropping a transparent resin on them, and a fourth method is a method for further molding them using a opaque resin after dropping it.

Since a cap is preferably omitted in order to reduce the number of parts to lower the cost, it is necessary for the resin for directly coating the optical device to be transparent. In order to prevent the stray light which comes in and goes out of the module, it's outermost surface is preferably opaque. Accordingly, the fourth method which has not been present in the past is more desirable, which molds an opaque resin on a dropped transparent resin.

In the case of the comprehensive molding method, the following step is taken. At least the optical device and the optical fiber are placed on the base of the package, and the transparent resin is dropped on the optical device and the fiber to fix them. By doing so, the optical device and the fiber are directly encapssulated with the transparent resin, after which the transfer molding is performed.

More practically, at least the optical device, the fiber, and the lead frame are fixed to the substrate, and the base plate assembly is inserted to the module, and the transfer molding is performed except the outer portion of the fiber and the outer lead portion of the lead frame.

According to the means for directly coating the optical device and the optical fiber with the transparent resin, the deterioration of the optical device or the fiber caused by the moisture absorption of the transfer molding package can be prevented, and in addition, the molding pressure applied to the coupling portion between the optical device and the optical fiber can be dispersed, and the residual stress after molding can be relieved. Accordingly, there is the effect that the optical coupling characteristic between the optical device and the optical fiber can be further stabilized, and the reliability of the optical module can be further enhanced.

In the module for fiber optic transmission, the silicone resin is not necessary for preventing optical damage. However, silicone is advantageous in the following point. Paying attention to the fact that the elastic modulus of the silicone resin is lower than that of the epoxy resin, the thermal stress applied to the optical device or the fiber is relieved so that the interface between the optical device and the resin is prevented from peeling. Accordingly, the corrosion caused by formation of a water film at the interface can be prevented.

It is noted that in the case where the transfer molding is employed in the comprehensive molding type, since the transfer pressure is applied to the transparent resin, the elastic modulus of the transparent resin should be high to some extent in order to prevent deformation. That is, it is necessary to select a transparent resin having the elastic modulus compatible with the lower thermal stress and the deformation prevention.

Various optical modules described above are mounted on the wiring substrate of the optical communication apparatus to make the optical communication apparatus high reliability and realize it at less cost. In this way, it is possible to provide an optical communication system which has high reliability and is inexpensive.

The effects of the present invention can be arranged as follows:

According to the first mode of the present invention, since the direction of the optical axis of the optical fiber of the resin case member is the direction of high elastic modulus in the resin, particularly at the main portion along at least the optical axis of the optical fiber in the base, the deformation of the base caused by the external heat is small, and the positional deviation between the optical device and the optical fiber does not occur.

According to the second form of the present invention, since the direction along an optical axis of the optical fiber is the direction of the low coefficient of thermal expansion in a resin material at a main portion along the optical axis of the optical fiber in the resin case member, the deformation of the base caused by the external heat is small, and the positional deviation between the optical device and the optical fiber does not occur.

According to the third mode of the present invention, since at the main portion supporting at least the optical axis of the optical fiber in the resin case, the orientation of the molecular chain of the resin is substantially parallel with the optical axis of the optical fiber, the elastic modulus of the case in the direction of orientation of the molecular chain is enhanced, and as a result the thermal expansion rate can be reduced. Accordingly, the deformation of the base caused by the external heat is small, and the positional deviation between the optical device and the optical fiber does not occur.

According to the fourth mode of the present invention, the direction of the optical axis of the optical fiber is generally parallel with the orientation of the molecular chain of the resin constituting the lengthwise direction of the resin case. Because of this, the elastic modulus of the case in the direction of the orientation of the molecular chain is enhanced, and as a result, the thermal expansion are can be reduced. Accordingly, the deformation of the case caused by the change in temperature and the external force can be suppressed, and the stress applied to the constituent member of the optical module is reduced. As a result, the optical coupling between the optical device and the fiber can be maintained stable for a long period of time.

According to the fifth form of the present invention, it is possible to comprehensively mold the optical device and the fiber by the transfer molding stably and in a short period of time, the lower cost can be achieved, the molten thermosetting resin is flown along the fiber installed within the mold to enable the suppression of variation of the optical coupling characteristic during molding, and the residual stress applied to the fiber after molding can be relieved. Accordingly, the reliability of the optical module including the moisture resistance can be enhanced.

The present invention is capable of providing an optical communication apparatus and an optical communication system which are low in price and has a high reliability.

BEST MODE FOR CARRYING OUT THE INVENTION

Embodiment 1

The first embodiment is an example of the aforementioned "resin case type", more concretely, an example of a pigtail type optical transmission module for a resin case type package. The main characteristic thereof lies in that when a base and a cap of the package are molded, the flowing direction of a liquid crystal polymer is parallel with the direction of an optical axis of the optical fiber. With this, a molecular chain is oriented along the direction of the optical axis. Thereby, the elastic modulus of the optical package and the cap in that direction can be improved, and the coefficient of thermal expansion can be reduced. It is noted in this example that as a package molding method, an injection molding method is employed, and as a sealing method for an optical element and an optical fiber, a dropping method is employed. For the dropping, a low elastic resin is used.

Figure 1A:
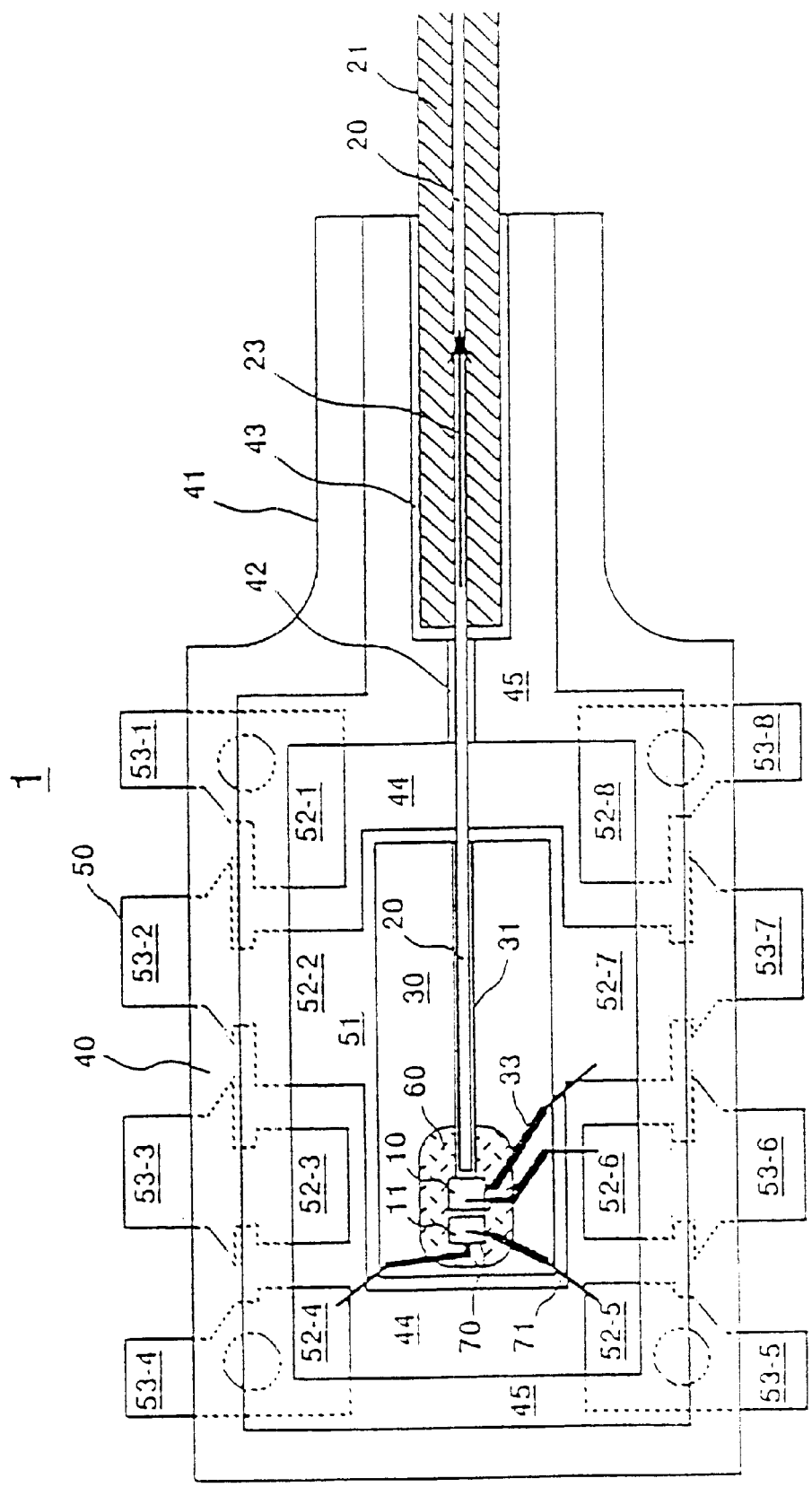
FIG. 1A is a plan view of assistance in explaining the pigtail type optical module according to a first embodiment of the present invention.
Figure 1B:
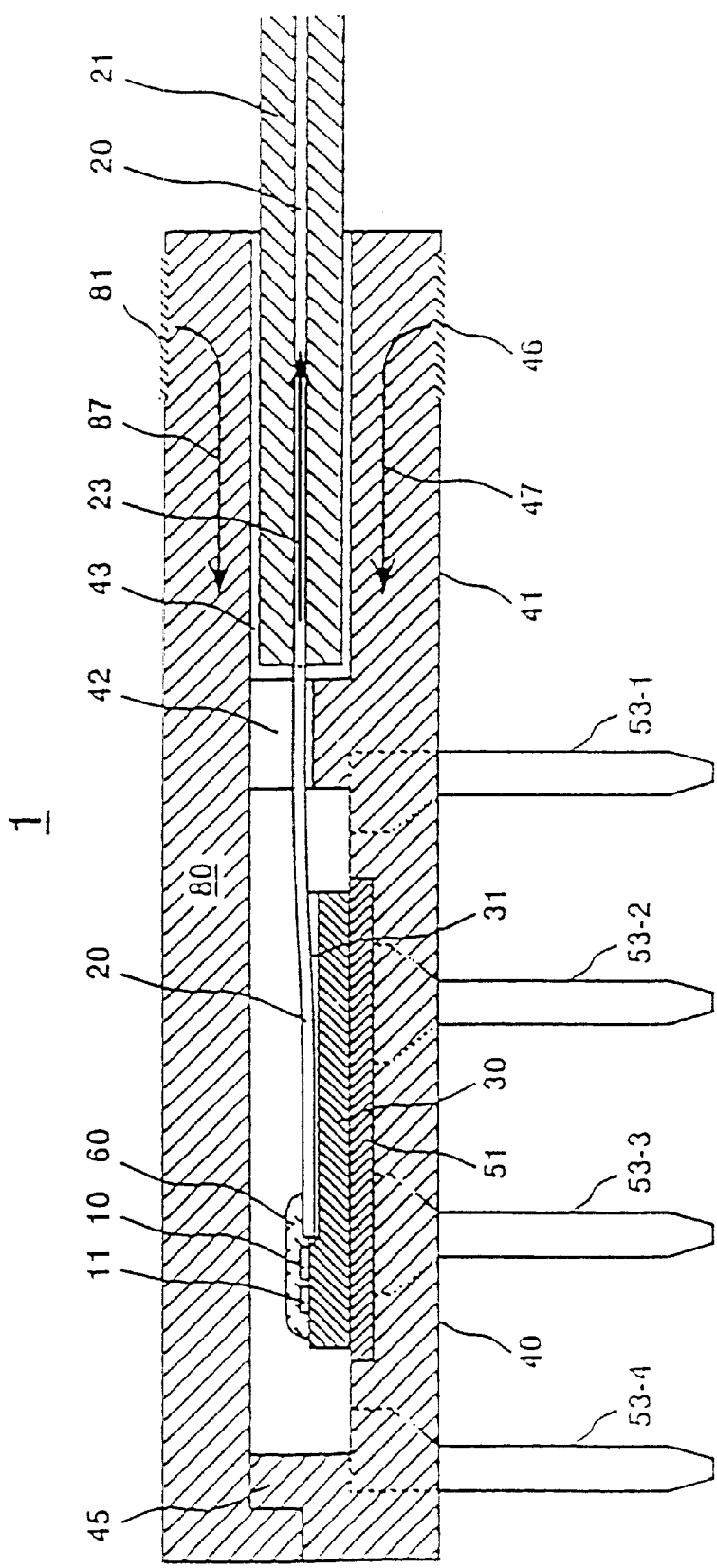
FIG. 1B is a sectional view in the direction parallel to the optical axis of assistance in explaining the pigtail type optical module according to the first embodiment of the present invention.
Figure 1C:
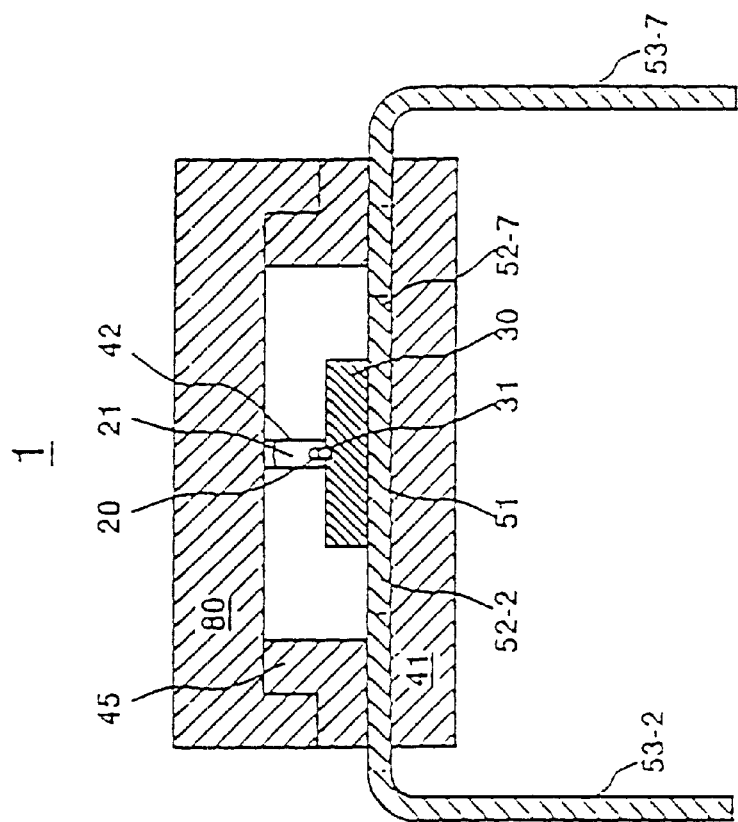
FIG. 1C is a sectional view in the direction crossing with the optical axis of assistance in explaining the pigtail type optical module according to the first embodiment of the present invention.

The first embodiment according to the present invention will be explained in detail with reference to the drawings. FIGS. 1A, 1B and 1C are respectively views of assistance in explaining the optical module according to the first embodiment of the present invention. These drawings show the pigtail type optical transmission module for the resin case type package. FIG. 1A is a partial plan view as viewed from the top, FIG. 1B is a partial sectional view as viewed from the side, and FIG. 1C is a sectional view in the direction crossing with the optical axis of the optical fiber.

As shown in FIGS. 1A, 1B and 1C, the resin case type plastic package receives therein optical devices 10, 11, a bare fiber 20 at the extreme end of the pigtail type optical fiber, and a substrate 30 for mounting members such as the optical devices. These members are sealed within a cavity 44. The cavity 44 is formed mainly by a base 40 and a cap 80. A lead frame 50 is formed integrally with a resin case type plastic package 40.

The optical devices 10, 11 are provided on the substrate 30 by die-bonding, and the bare fiber 20 is fixedly mounted in a V groove 31 provided in the substrate 30. In this manner, the optical device 10 and the fiber 20, and the optical device 10 and the optical device 11 are optically coupled with each other. The extreme ends of the optical devices 10, 11 and the fiber 20 are encapsulated with a transparent resin 60. In this manner, the substrate 30 having the optical devices 10, 11 and the fiber 20 placed thereon is fixedly mounted on a die pad 51 extending from the lead frame 50. The die pad 51 is installed within the cavity 44.

The base 40 of the plastic package is provided at one end thereof with an optical fiber holder portion 41 normally in the form of a U groove. The bare fiber 20 and a jacket 21 covering the bare fiber 20 are fixedly mounted in a U groove 42 and a U groove 431 respectively. The cap 80 is fitted over and adhered to a projection portion 45 of the plastic package 40.

The optical device 10 comprises an end-face emitting type laser diode formed from an InP semiconductor. The emission wavelength thereof is 1.3 μm, the forward output is for example, 7 mW, and the half-value total angle of a far field pattern is for example, 25×30° (approximately 1.1×0.9 μm in spot size).

The optical device 11 comprises an end-face receiving type (a waveguide type) photodiode formed from an InP semiconductor, in order to monitor a rearward output of the optical device 10. The optical devices 10, 11 are provided at a predetermined position of the substrate 30 by die-coupling by means of an Au—Sn solder in junction down manner. A marker for alignment relative to the substrate 30 is formed on the surface on the junction side of the optical devices 10, 11. It is set so that the thickness of the Au—Sn solder layer is for example, 3 μm, and the height of an active layer of the optical devices 10, 11 from the surface of the substrate 30 is for example, 8 μm.

The optical fiber 20 comprises a single mode quartz fiber. The outside diameter is for example, 125 μm, and the spot size is for example, 5 μm. The emission light of the optical device 10 is coupled to the fiber 20, propagated within the optical fiber 20 in the optical axis direction 23 and output. In the case where the end of the optical fiber 20 is vertically cut and coupled to the optical device 10 by the butt-joint coupling system, the coupling efficiency of approximately −8 dB on the maximum is obtained. In the case where a lens is formed on the end of the optical fiber 20 by etching by way of a buffer fluorine solution or by a discharge melting processing and coupled by a prespherical lens-end coupling system, approximately −3 dB on the maximum is obtained. The rear portion of the optical fiber 20 is protected by means of a jacket 21 to constitute a pigtail fiber. The jacket 21 is formed of nylon and has the outside diameter of, for example, 0.9 mm. The portion adhered to the U groove 43 of the jacket 21 is sometimes applied with a roughening processing or chemical processing in order to improve the adhesive properties.

The base plate 30 is formed from, for example, a silicon crystal substrate of a surface orientation (100). The substrate 30 is provided with a V groove 31 for locating the optical fiber 20 with high accuracy, and a wiring 33 for driving the optical devices 10, 11. A marker for alignment (not shown) is formed at a position for fixing the optical devices 10, 11. The V groove 31 and the marker are constituted using the (111) crystal surface of the silicon crystal and the surface equivalent thereto.

The V groove is simultaneously formed by anisotropic etching relative to the silicon crystal surface in a KOH aqueous solution. The V groove 31 has the width of, for example, 142 μm, and is processed so that the height of the optical axis at the extreme end of the fiber 20 coincides with the height of the active layer of the optical devices 10, 11 as viewed from the surface of the substrate 30.

The wiring 33 comprises a normal Au/Pt/Ti film or Au/Ni/Cr film and is vapor-deposited on the insulating film of the surface of the substrate 30. While a wiring pattern in FIG. 1A-1 is depicted schematically, it is to be noted of course that the width and thickness of the wiring 33, and the thickness of the insulating film are determined in consideration of the load capacitance and the thermal resistance of the optical devices 10, 11.

The package base 40 comprises a dual inline package (DIP) of 8-pin. An external form of the package 40 in the present embodiment is illustrated such that the length is 14.6 mm (including the length (5 mm) of the fiber holder portion), the width is 6.3 mm, and the height is 3 mm. The package base 40 is provided with a cavity 44, U grooves 42, 43, and a projection 45. The widths of the U grooves 42, 43 correspond to the outside diameter of the fiber 20 and the jacket 21 secured thereto (in consideration of FIG. 1C). In this manner, the sealability of the package 40 is improved, and the protrusion of the fiber 20 from the jacket 21 is prevented. The depth of the U grooves 42, 43 is designed so that the height of the fiber 20 increases from the extreme end thereof (V groove 31) to the U groove 42. This is because the distortion caused by the external force and the thermal expansion are absorbed by flexure of the fiber 20. The projection portion 45 in the outer periphery of the package 40 is provided in order to increase the rigidity of the base 40 of the package and to improve the adhesive properties thereof with the cap 80.

The base 40 and the cap 80 of the package are formed of a black liquid crystal polymer which is one kind of thermoplastic resins. They are subjected to injection molding by flowing, in molding, the liquid crystal polymer in the directions indicated by arrows 47, 87 from gate portions 46, 81. In the mold in the first embodiment, pin gates are used, and the gate portions 46, 81 are positioned on the upper and lower surfaces of the fiber holder portion 41. The flowing directions 47, 87 of the resin are substantially parallel with the optical axis direction 23 of the fiber 20. For the mold itself, a normal mold will suffice. In FIG. 1B, the mold is not shown.

The liquid crystal polymer has a variety of grades. In the first embodiment, a glass-fiber reinforced grade was selected from a viewpoint of high rigidity, low thermal expansion and moldability. In molding of the liquid crystal polymer, since the molecular chain is oriented strongly in the flowing direction, attention was also paid to the anisotropy in the direction at right angles (⊥) with the flowing direction (//). In the liquid crystal polymer used in the first embodiment, the elastic modulus is 14 GPa (//) and 4 GPa (⊥), the coefficient of thermal expansion is 5 ppm/° C. (//) and 60 ppm/° C. (⊥), and the shrinkage ration in molding is 0.1% (//) and 0.5% (⊥). As other typical characteristics, the dielectric constant is approximately 4, the water absorption rate is 0.01%, and the soldering heat resistance is 30 seconds at 300° C. With respect to the moldability, good molding less burr can be carried out under the conditions of 350° C. of cylinder temperature, 80° C. of mold temperature, 40 MPa of injection pressure, and 20 seconds of molding cycle time.

The lead frame 50 is insert-molded into the base 40 of the package. As materials for the lead frame 50, in the case where the optical device 10 is used at high output/high temperature, and in the case where it is used at relatively low output/low temperature, a Cu alloy of high heat conductivity, and a Fe—Ni alloy of low heat expandability are respectively used. A die pad 51 and inner leads 52-1 to 8 to which the substrate 30 is fixed secured are exposed to the inner surface of the cavity 44, and outer leads 53-1 to 8 extend externally of the package 40. The pitch of the outer leads 53-1 to 8 is for example, 2.54 mm, and the width between the 53-1 to 4 and 53-5 to 8 is for example, 300 mil (7.62 mm). The die pad 51 is connected to the outer leads 52-2 and 52-7. The outer leads 53-6, 7 are electrically connected to the optical device 10 through Au wires 70, 71, and the outer leads 53-4, 5 are electrically connected to the optical device 11. The transparent resin 60 comprises a soft gel-like silicone resin. The refractive index of the transparent resin 60 in the wavelength of 1.3 µm is 1.4, which generally matches with that of the optical fiber 20. The transparent resin 60 is coated on the optical devices 10, 11 and the extreme ends of the optical bare fiber 20 (the whole surface of the bare fiber 20 according to the specification of reliability) into intimate contact therewith. Further, the transparent resin is filled between the forward end of the optical device 10 and the end of the optical fiber 20, and between the rearward end of the optical device 10 and the light receiving end of the optical device 11 to enhance the optical coupling efficiency therebetween (enlarging the allowable accuracy of alignment) and eliminate the reflecting and returning light from the end of the optical fiber 20 to the optical device 10.

Next, the assembly steps of Example of the optical module 1 according to the first embodiment will be explained schematically.

(1) The base 40 and the cap 80 of the package are injection-molded in advance by a well-known method. In this case, it is important, as described in detail previously, that particularly the base 40 be molded by flowing the resin so as to be substantially parallel with the optical axis of the optical fiber.

(2) The markers for the optical devices 10, 11 and the substrate 30 are recognized, for example, by an infrared ray image to effect alignment thereof. The load force is applied to the optical devices 10, 11, which are temporarily pressed to the substrate 30 preheated.

(3) An Au—Sn solder is caused to reflow, and the optical devices 10, 11 are subjected to die bonding to the substrate 30.

(4) The substrate 30 is fixedly adhered to the die pad 51 by a electro-conductive (high heat conductive) epoxy resin.

(5) A portion between the optical devices 10, 11 and the wiring 33 of the substrate 30 and a portion between the wiring 33 and the inner leads 52-4 to 7 are subjected to bonding by wires 70, 71.

(6) The extreme end of the optical fiber 20 is fixedly adhered to the V groove 31 by a ultraviolet curable resin so that a spacing between the forward end of the optical device 10 and the end of the fiber 20 assumes a predetermined distance.

(7) The optical fiber 20 and the jacket 21 are fixedly secured to the U grooves 42, 43 by the epoxy resin.

(8) The transparent resin 60 is dropped on the optical devices 10, 11 and the optical fiber 20 to thermoset it.

(9) The cap 80 is fixedly secured to the package 40 by the epoxy resin (or welded by applying a supersonic wave) to seal the package 40.

(10) A dam bar (not shown) or a tie bar (not shown) of the lead frame 50 is cut to bend the outer leads 53-1 to 8 into a predetermined shape.

In this manner, the assembly of the module is completed.

In Example of the optical module 1 according to the first embodiment, the base 40 and the cap 80 of the resin case type package are injection-molded by a liquid crystal polymer of thermoplastic resin. Thereby, as compared with the case where they are molded with general thermosetting resin, the time required for resin hardening is unnecessary, as a result of which the molding cycle time can be reduced to ⅕. Further, burr removing process and curing after molding can be omitted.

Further, the use of the thermoplastic resin can reduce the quantity of materials used. The main reasons thereof are as follows: (1) The loss of the resin material during molding is small. (2) The recycle material can be molten again for use up to 20 to 25%. Thereby, there is an effect that the molding cost for the package 40 and the cap 80 can be reduced.

Since in the first embodiment, the flowing directions 47, 87 of the liquid crystal polymer when the base 40 and the cap 80 of the package are molded are parallel with the direction 23 of the optical axis of the optical fiber 20, the molecular chain of the liquid crystal polymer is oriented along the optical axis direction 23. Thereby, it is possible to enhance the elastic modulus of the optical package 40 and the cap 80 in that direction, and to reduce the coefficient of thermal expansion. Normally, in the pigtail type module, the tensile stress in the optical axis direction or the bending stress is applied particularly to the fiber holder portion. However, in the optical module shown in the first embodiment, the sufficient mechanical strength can be secured, and the external stress applied to the optical fiber 20 can be suppressed. Further, the coefficient of thermal expansion of the package 40 and the cap 80 in the optical axis direction 23 is 5 ppm/° C. This value is close to the silicon substrate 30 (3 ppm/° C.) as compared with the perpendicular coefficient (60 ppm/° C.) and the normal plastic (in order of 10 ppm/° C.). Accordingly, since a difference from the optical fiber 20 (0.5 ppm/° C.) formed of quartz is small, the thermal stress applied to the optical fiber 20 can be reduced.

Further, in the first embodiment, both the external stress and the thermal stress can be relieved by providing the flexure for the optical fiber 20. That is, as shown in FIG. 1B, since the height of the bottom surface of the U groove 42 supporting the optical fiber 20 is higher than that of the optical device 10, the optical fiber 20 is provided with the flexure. This flexure absorbs expansion and contraction caused by the external stress and the thermal stress.

Accordingly, according to the first embodiment, there are effects that the crack of the optical fiber 20 caused by the stress concentration can be prevented, and the fluctuation of the optical coupling efficiency resulting from the positional misalignment of the extreme end of the optical fiber 20 caused by the stress (that is, the deterioration of the optical output from the fiber 20) can be suppressed. Incidentally, the optical module 1 is subjected to the temperature cycle test (−40° C.−+85° C., 1 hr/cycle), and as a result, the fluctuation of the optical output from the fiber 20 up to thousands of cycles at the present time is within ±0.5 dB, the sufficient stress resistance being assured.

As measures for moisture resistance, in the first embodiment, the U grooves 42, 43 and the projection portion 45 are provided in the base 40 of the package to enhance the adhesion between the base 40 and the outer periphery of the cap 80, between the U groove 42 and the fiber 20, and between the U groove 43 and the jacket 21. Thereby, the base 40 of the package can be sealed easily and certainly by the cap 80 to suppress an immersion of water into the cavity 44.

Further, the transparent resin 60 is dropped onto the optical devices 10, 11 and the bare fiber 20 to seal them whereby even if water moves into the cavity 44, water is not condensed in the interface therebetween. In this manner it is possible to prevent the corrosion of the optical devices and the deterioration of the fiber 20.

Further, as the transparent resin 60, a silicone gel which is soft and has a low elasticity is used whereby even if there is a difference in thermal expansion between the optical devices 10, 11 and the fiber 20 and the transparent resin 60, the stress applied to the interface therebetween can be relieved, and therefore the adhesion of the transparent resin 60 can be secured over a long period of time. Accordingly, according to the first embodiment, there is an effect that the moisture resistance can be enhanced by adequately jointly using the cap sealing method and the dropping method. The optical module 1 is subjected to the high temperature high moisture operating test (85° C., 85%) in addition to the temperature cycle test. The fluctuation of the optical output from the fiber 20 up to thousands of hours is within ±0.5 dB, thus obtaining the sufficiently satisfactory result.

While in the first embodiment, a liquid crystal polymer of a glass fiber-reinforced grade is used as a package molding material, it is to be noted that other thermoplastic resin materials can be used according to needs such as the rigidity, low thermal expansion, moldability, heat resistance, charging properties, flame proof, etc. These examples that can be mentioned on a liquid crystal polymer such as a filler reinforced-type grade and a carbon fiber reinforced-type grade, a cross-linked type PPS resin, a linear type PPS resin, a polybutylene terephthalate (PBT) etc. Further, it is also possible to use a grade capable of plating so that for example, as counter-measures for electromagnetic noise, aplating is applied to the inner surface of the cap.

A mold for injection molding in the first embodiment employs a pin gate, and a gate portion is provided on the lower surface of the fiber holder portion. If the flowing direction of the resin is generally parallel with the optical axis of the optical fiber, a side gate, a submarine gate or the like can be used. Even if the gate portion is provided opposite to the fiber holder portion (left-hand in FIG. 1A), the effect of the present invention can be substantially exhibited. When the module is viewed from the top as in FIG. 1A, the gate portion may be provided on the optical axis or the extending line therefrom.

Further, a plurality of cavities and a plurality of gates are provided on the molding mold and a multiple lead frame is used whereby a plurality of packages can be molded at the same time. For example, if the plurality of cavities are arranged vertically to the optical axis to constitute a mold, the number of obtaining packages increases to enhance the productivity.

In the first embodiment, as the resin sealing method, the package is sealed by the cap, and the optical device and the fiber are sealed by the dropping method. However, the package is filled with the transparent resin by the potting injection method in order to enhance the stress resistance and the moisture resistance, as the case may be. Further, the cap or the transparent resin is omitted in consideration of the sealing cost and the reliability, as the case may be.

Further, while the cap material has been the same resin material as the base of the package, it is noted that it can be sometimes changed to a metal cap or a ceramic cap for the convenience's sake of component supply or the like. While a transparent silicone gel has been used as a sealing material for the optical device and the fiber, other encapsulation materials, for example, such as silicone rubber, a low stress epoxy resin (for example, silicone denatured epoxy), an acrylic resin, a urethane resin, etc. may be employed in consideration of the elastic modulus, moisture permeability, refractive index, adhesive properties, etc.

As forms of the package and the terminal, forms other than the DIP type illustrated in the first embodiment can be of course used according to the conditions of the optical device, the optical fiber, and the optical module to be used. Examples may include a small outline package (SOP) type, a plastic leaded chip carrier (PLCC) type, a leadless chip carrier (LCC) type, a pin grid array (PGA) type, a ball grid array (BGA) type, etc. In the case where one optical element need not be driven, for example, in the case of a passive optical element, a terminal need not-be provided electrically.

The optical devices has a wide range of application in the present invention including, in addition to the laser diode and the photodiode shown in the first embodiment, active optical devices such as an optical amplifier, an optical modulator and an optical switch, passive optical devices such as an optical coupler and an optical wavelength multiplexer/demultiplexer, a semiconductor optical device and a dielectric optical device, a hybrid optical integrated circuit in which optical devices are mounted on an optical waveguide substrate or an electronic circuit substrate, a monolithic optical integrated circuit having an optical device and an electronic circuit integrated, and an optical device as fiber.

The optical fibers that can be used include, in addition to a single mode quartz fiber, a multimode fiber, a plastic fiber and so on. Not only one but a plurality of optical fibers may be used. Forms of the fiber include a form used as a fiber array and a fiber ribbon, and a form in which the fiber is attached or connected in some surfaces of the package.

Further, the present invention is effective not only in the case where the optical module has the fiber in explicitly but also in the case where the receptacle type module has the fiber in implicity.

While in the first embodiment, a silicon substrate has been used to enhance the alignment accuracy of the optical device and the fiber and enhance the heat dissipation of the optical device, but a printed board, a ceramic substrate, a thin film substrate or the like may be used according to the specification of the processing accuracy, cost, heat resistance, dielectric constant and so on. The present invention can be applied to the case where no wiring is present in the substrate and the case where no substrate is used.

In the fiber optic transmission system, the optical module is mounted on the wiring substrate (a printed board, a ceramic thick-film substrate, and a thin-film substrate) together with LSI and electronic parts and used as an optical communication apparatus. As shown in the first embodiment and other embodiments described later, the optical module according to the present invention is excellent in the stress resistance and the moisture resistance in addition to the moldability, and needless to say, also as the optical communication apparatus, the lower cost and higher reliability can be realized.

Embodiment 2

The second embodiment provides an example of the above-described "Comprehensive molding type package", more specifically, an example of a pigtail type optical transmission module by way of a comprehensive molding type package. Its main characteristic lies in that when a package is molded, the flowing direction of an epoxy resin is parallel with an optical axis direction of a fiber. Accordingly, since the flowing pressure of resin is not applied at vertically to the side of the fiber or jacket, the fiber or the jacket is not distorted at sideways, and molding is not made in the state where the alignment of the optical device and the fiber is deviated. Note that in this example, as the sealing method for the optical device and the fiber, a dropping method using a low elastic resin is used.

Figure 2A:
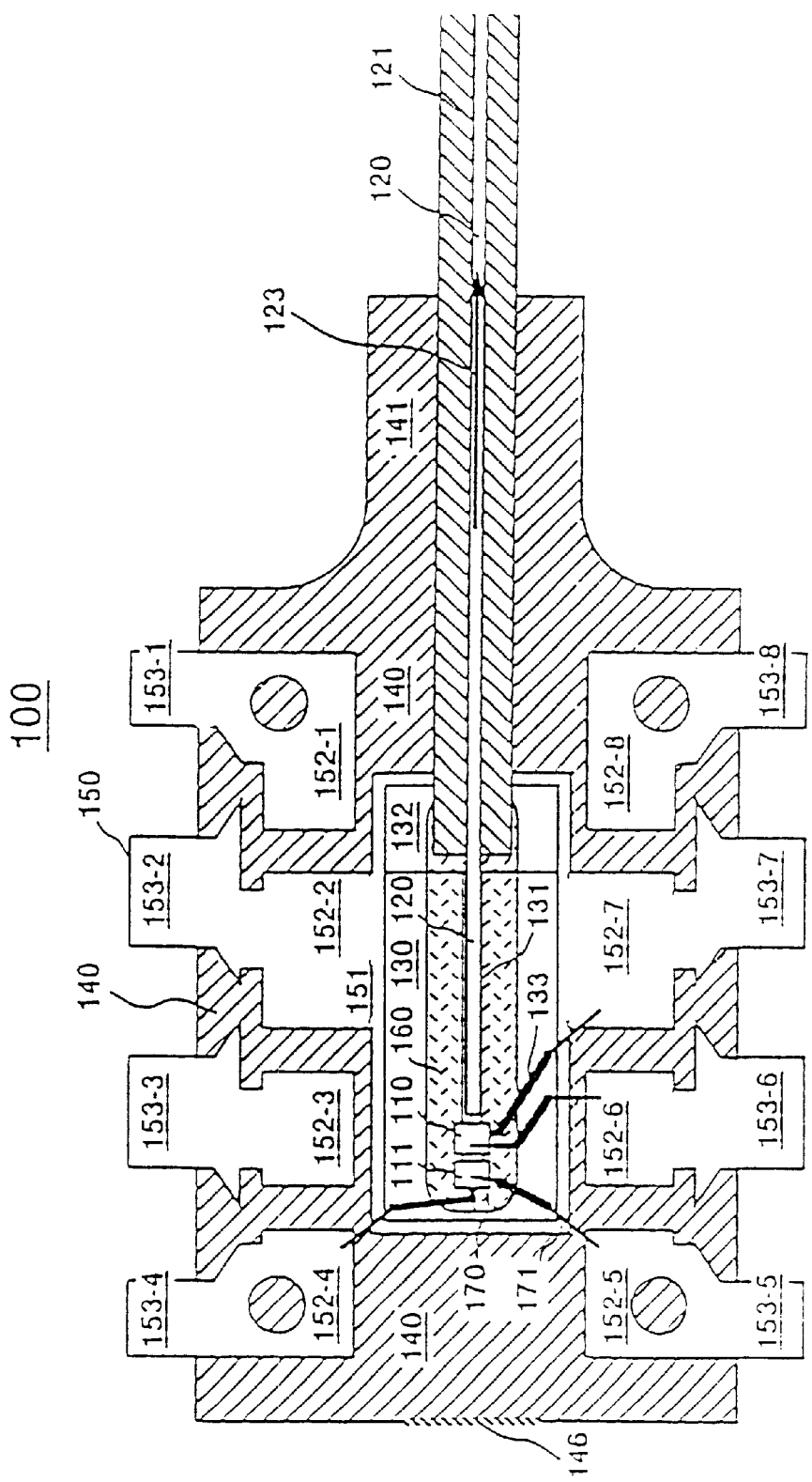
FIG. 2A is a plan view of assistance in explaining the pigtail type optical module according to a second embodiment of the present invention.
Figure 2B:
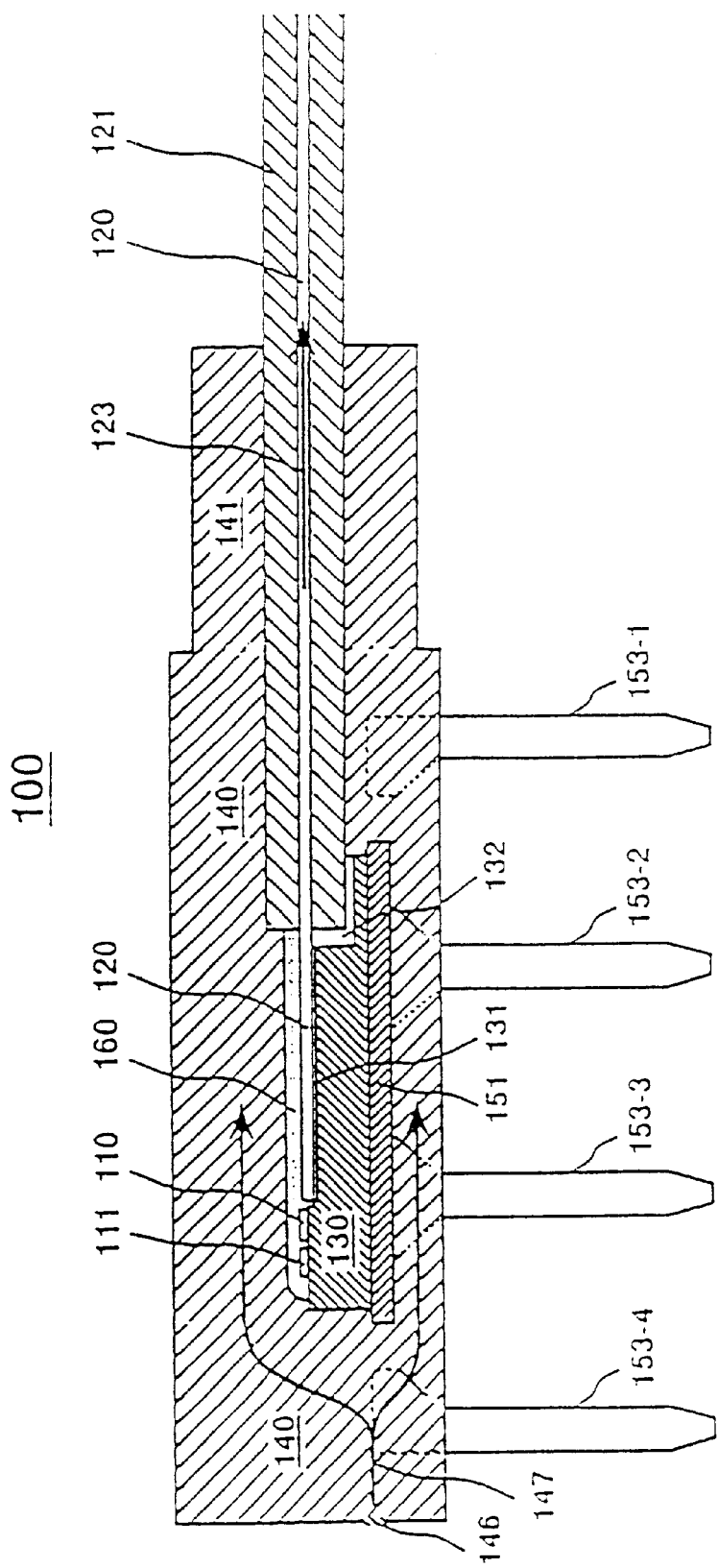
FIG. 2B is a sectional view in the direction parallel to the optical axis of assistance in explaining the pigtail type optical module according to the second embodiment of the present invention.
Figure 2C:
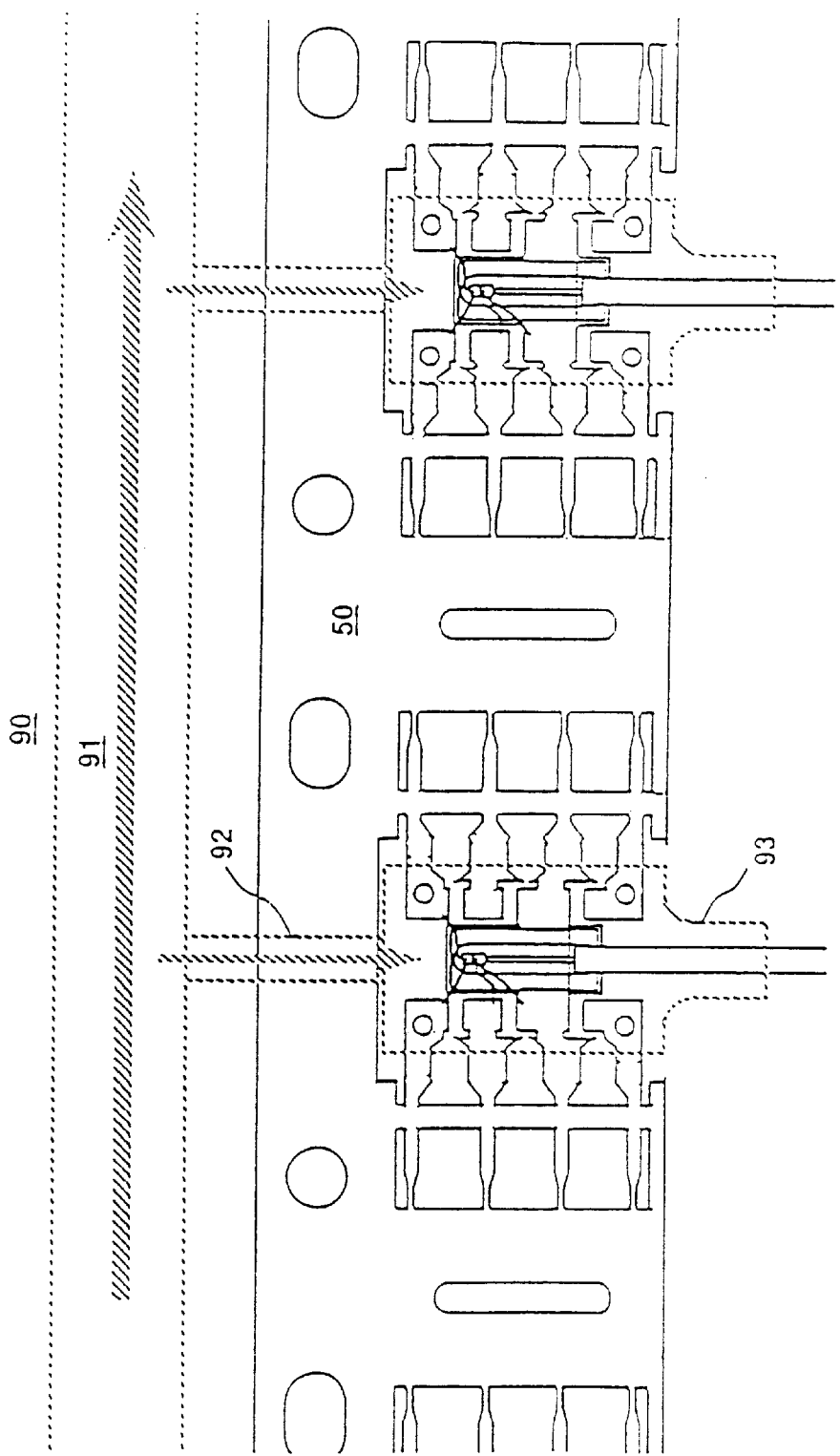
FIG. 2C is a plan view showing the mode for manufacturing the pigtail type optical module according to a second embodiment of the present invention.

FIGS. 2A and 2B are respectively views of assistance in explaining the optical module according to the second embodiment. The present example shows a pigtail type optical transmission module by way of a comprehensive molding type package. FIG. 2A is a partial plan view as viewed from the top, and FIG. 2B is a partial sectional view as viewed from the side. FIG. 2C is a plan view showing the form in the case where the present modules are produced in mass using a multiple lead frame.

An optical module 100 shown in FIGS. 2A to 2C comprises optical devices 110, 111, an optical fiber 120, a substrate 130, a comprehensively molded plastic package 140, and a lead frame 150. The extreme end of the pigtail fiber of the optical fiber inserted and sealed in the resin.

The optical devices 110, 111 are subjected to die bonding to the substrate 130. The bare fiber 120 and the extreme end of a jacket 121 for coating thereof are fixedly secured to a V groove 131 and a recessed groove 132 provided in the substrate 130 respectively. The optical device 110 and the optical fiber 120, and the optical device 110 and the optical device 111 are optically coupled each other. The base plate 130 having the optical devices 110, 111 and the optical fiber 120 placed thereon are fixedly secured onto a die pad 151 extending from a lead frame 150. The jacket 121 is inserted into a fiber holder portion 141. The optical devices 110, 111 and the bare fiber 120 are encapsulated with a transparent resin 160.

Parts substantially similar to those shown in the first embodiment are used for the optical devices 110, 111, the fiber 120, the substrate 130 and the lead frame 150. However, for the optical device 110, a high power laser diode (forward output; 10 mW) was used. The optical devices 110, 120 are subjected to die bonding to the substrate 130 by the method similar to the first embodiment. A laser beam emitted out from the optical device 110 is output along the optical axis direction 123. The jacket 121 of the optical fiber 120 is formed of a nylon resin having a higher heat resistance than the first embodiment for carrying out transfer molding.

The substrate 130 is formed with a V groove 131 similar to the V groove 31, and a wiring 133 similar to the wiring 33. However, the recessed groove 132 is not present in the first embodiment. The recessed groove 132 is formed by dicing process corresponding to the outside diameter of the jacket 121. This is because of enhancing the adhesive properties of the jacket 121 and the optical fiber 120 to the substrate 130 in consideration of the flowing pressure of resin during the transfer molding.

As material for the lead frame 150, a Cu alloy is used since the output of the optical device 110 is higher than the optical element 10. Inner leads 152-1 to 8 are embedded in the package 140, and outer leads 153-1 to 8 are taken out outside the package 140. The outer leads 153-6 and 7 are electrically connected to the optical device 110 through a wiring 133 and wires 170, 170. The outer leads 153-4 and 5 are electrically connected to the optical device 111.

The package 140 is constituted by comprehensive transfer molding the optical devices 110, 111, the optical fiber 120, the jacket 121, the substrate 130 and the lead frame 150. The package 140 is formed from a 8-pin dual in-line package (DIP), whose sizes are such that for example, length is 13 mm (including length of 3.4 mm of the fiber holder portion), width is 6.3 mm, height is 3 mm, outer lead pitch is 2.54 mm and lead width is 300 mil.

The reason why the package of the second embodiment is short as compared with the first embodiment is that in the first embodiment, the optical fiber 20 is fixedly secured to the U groove 42 of the package 40, whereas in the second embodiment, the jacket 121 is fixedly secured to the recessed groove 132 of the substrate 130 so that the package 140 is sealed by transfer molding. This is because that in the first embodiment, the package 40 is sealed by the cap 80, and in the second embodiment, the package 140 is sealed by transfer molding.

Transfer molding material for the package 140 comprises a black thermosetting epoxy resin. In the second embodiment, a low temperature setting and low thermal expansion epoxy resin was used. This is because of considerations that the resin molten during molding directly touches the jacket 121, and that after molding, the resin covers arround the optical devices 100, 110 and the fiber 120. The elastic modulus of this resin is 13 GPa, and the coefficient of thermal expansion is 9 ppm/° C.

The epoxy resin is transfered under compression into the mold from the gate portion 146 on the conditions that the plunger pressure is 8 MPa, and the molding cycle time is 90 seconds to thereby mold the package 140. The gate portion 146 is present opposite to the fiber holder portion 141, and the flowing direction 147 of the epoxy resin in the mold is generally parallel with the optical axis direction 123 of the fiber 120. It is noted that care is taken to arrangement of an ejector pin of a mold so that when the module is removed from the mold, surplus stress is not applied to the optical device and the fiber.

Prior to the transfer molding, the transparent resin 160 is dropped on the optical devices 110, 111 and the portion not protected by the jacket 121 of the bare fiber 120 to thermally set them. As material for the transparent resin 160, a silicone resin having a hardness somewhat higher than that of the transparent resin 60 in the first embodiment was selected in a range in which the thermal stress to the optical devices 110, 111 and the fiber 120 pose no problem. This is because of preventing the transparent resin 160 from being deformed in the flowing direction 147 of resin during the transfer molding. The refractive index of the transparent resin 160 is substantially the same as that of the fiber 120, which is useful for improvement in the optical coupling characteristic and prevention of reflection of the fiber end.

Next, the assembly steps of the optical module 100 according to the second embodiment will be explained schematically. The steps 1 to 5, 7, 9 and 10 of the second embodiment corresponds to the steps 2 to 6, 9, 11 and 12 of the first embodiment.

(1) The markers for the optical devices 110, 111 and the substrate 130 are recognized by an infrared ray image to effect alignment thereof.

(2) The load force is applied to the optical devices 110, 111, which are temporarily pressed to the substrate 30 preheated. And, an Au—Sn solder is caused to reflow, and the optical devices 110, 111 are subjected to die bonding to the substrate 130.

(3) The substrate 130 is fixedly secured to the die pad 151 by a electro-conductive (high heat conductive) epoxy resin.

(4), A portion between the optical devices 110, 111 and the wiring 133 of the substrate 130 and a portion between the wiring 133 and the inner leads 152-4 to 7 are subjected to bonding by wires 170, 171.

(5) The extreme end of the optical fiber 120 and the extreme end of the jacket 121 are fixedly secured to the V groove 131 and the recessed groove 132, respectively, by a ultraviolet curable resin or a thermosetting resin so that a spacing between the forward end of the optical device 110 and the end of the optical fiber 120 assumes a predetermined distance.

(7) The transparent resin 160 is dropped on the optical devices 110, 111 and the optical fiber 120 to heat-set it.

(8) The lead frame 150 is set to the mold, and the package 140 is subjected to transfer molding and sealed. In this case, as previously described, it is important that the direction for introducing the resin be substantially parallel with the optical axis direction of the optical fiber.

(9) A dam bar (not shown) or a tie bar (not shown) of the lead frame 150 is cut to bend the outer leads 153-1 to 8 into a predetermined shape.

In this manner, the assembly of the module 100 is completed. Normally, in this stage, the predetermined inspection of characteristics and reliability is carried out.

In the optical module 100 of the second embodiment where the resin is transferred with compassion into the mold to form the package 140, as compared with the case where the resin is flown into the mold form to form a package by the casting injection method, the molding cycle time is shortened to prevent voids in the package and to carry out molding with accuracy. Accordingly, there is the effect that the productivity of the module 100 is enhanced, and the quality in connection with the shape, the reliability and so on is stabilized.

Since in the second embodiment, when the package 140 is molded, the flowing direction 147 of the epoxy resin is parallel with the optical axis direction 123 of the fiber 120, the resin flows along the fiber 120 and the jacket 121. Accordingly, since the flowing pressure of the resin is not applied at right angles with the fiber 120 or the jacket 121, the fiber 120 or the jacket 121 is not distorted in the perpendicular direction, and molding will not be performed in the state in which alignment between the optical device 110 and the fiber 120 is deviated.

Further, since the optical devices 110, 111 and the fiber 120 are protected by the transparent resin 160, the flowing pressure is not applied directly thereto, and the internal stress is dispersed after molding. Further, since in the second embodiment, no hollow portion like the cavity 44 in the first embodiment is present, the rigidity of the package 140 is high. Furthermore, since the coefficient of thermal expansion (9 ppm/° C.) of the package 140 is relatively low, the thermal stress applied to the fiber 120 is small. Accordingly, there are effects that it is possible to prevent the deterioration of the optical devices 110, 111 and the optical fiber 120 due to the flowing pressure during molding and the external stress and thermal stress after molding, and the optical output from the optical fiber 120 can be stabilized.

It is noted that there is no significant difference in the result of measurement of optical output fluctuation before and after transfer molding and after temperature cycle test as compared with the test result of the first embodiment, but both the embodiments show the stress resistance for a long period of time.

In connection with the moisture resistance in the second embodiment, double sealing is made by the transparent resin 160 which is dropped or the optical devices 110, 111 and the optical fiber 120 and the resin subjected to transfer molding. Further, as compared with the first embodiment, the second embodiment is large in effect of suppressing the immersion of water arriving at the surfaces of the optical devices 110, 111 and the fiber 120 from the outside of the package. This is because the package 140 subjected to transfer molding in the second embodiment has no hollow portion as in the resin case type package 40 in the first embodiment, and the resin thickness in the second embodiment is large as compared with the first embodiment.

However, depending on the thermal expansion difference between the transparent resin 160 and the epoxy resin constituting the package 140 and the adhesive properties of them, a water film is sometimes formed in the interface therebetween, but the moisture resistance poses no problem. This is because since the adhesion of the transparent resin 160 with respect to the optical devices 110, 111 and the optical fiber 120 is good, the water film is not formed in the interface between the transparent resin 160, the optical devices 110, 111 and the fiber 120 even under the saturated vapor pressure of the transparent resin 160. Accordingly, the second embodiment has the effects that the corrosion of the optical devices 110, 111 and the rupture of the fiber 120 can be prevented, and the moisture resistance can be secured. This effect has been verified by the high temperature high moisture operating test similar to the first embodiment.

Comparing the second embodiment with the first embodiment with respect to the cost, since the second embodiment has no cap 80 as in the first embodiment, as a consequence of which the number of assembly steps in the second embodiment is less than the first embodiment by the steps (7) and (9) thereof. However, as compared with the injection molding of thermoplastic resin in the first embodiment, the transfer molding by the thermosetting resin in the second embodiment is long in molding cycle time, and requires the cure after molding, increasing the quantity of materials used. Further, it is necessary for the second embodiment to make the substrate 130 thicker than the first embodiment and to use the heat resistant jacket 121.

Comparing with respect to the package sizes, the second embodiment is advantageous in the following two points. That is, (1) since an adhesive interference as in the first embodiment need not be provided, miniaturization can be achieved. (2) Since the cap need not be fitted, the shape accuracy can be enhanced.

Comparing with respect to the heat dissipation, since the second embodiment has no hollow portion as in the first embodiment, a heat conductive capacity is large, and the heat resistance can be reduced by about 10 to 20 percent.

The selection of the first embodiment or the second embodiment in the concrete production is determined in total consideration of investment in molding/assembly equipment, component procuring method, specification of characteristics and reliability of optical device/fiber/module, and so on.

While in the second embodiment, the low temperature setting and low thermal expansion epoxy resin has been used as the transfer molding resin, it is to be noted that the composition of the base resin can be adjusted according to the desired properties to combine a filler and a elasticizer. For example, the base resin includes an epoxy resin or a silicone resin; the filler includes a silica filler or a synthetic filler; and the elasticizer includes a silicone oil or a silicone rubber. In the case where in molding, deformation of an optical fiber and a wire is reduced, a low viscosity and low speed molding resin is suitable, and in the case where a thermal stress after molding is reduced, a low elasticity and low thermal expansion resin is suitable. Further, a resin requiring no cure after molding is sometimes used in order to enhance moldability.

The gate portion for molding the second embodiment is positioned opposite to the optical fiber supporting position, but the position of the gate portion may be changed according to the module construction and moldability considering that the molding resin flows along the optical axis of the optical fiber. As the type of gates, an under gate, a center gate, an upper gate, a separate gate and so on can be properly used.

An example in which a number of modules are taken from the molding mold will be illustrated. FIG. 2C is a plan view showing a form in a case where the module is mass-produced using a multiple lead frame. A plurality of cavities 93 and a plurality of gates 92 are provided on a mold 90, and a multiple lead frame 50 is used. The plurality of cavities 93 are arranged along the runner (main flowpassage of resin) 91, and the mold 90 is constituted so that the optical axis is vertical with 110 respect to the runner 91 to thereby further increase the number of modules to be obtained.

In the second embodiment, the dropping of a transparent resin 160 and the resin sealing by the transfer molding are carried out. As the transparent resin, the resin material as mentioned in the explanation of the first embodiment can be also used. It is also possible to coat an over-coat resin on the transparent resin 160 in order to further enhance the moisture resistance.

Embodiment 3

In the third embodiment, as a packaging method, a transfer molding method which is a comprehensive molding mold is employed. As a sealing method for an optical device and a fiber, a dropping method is employed. In transfer molding of a package, with respect to the flowing of resins from the gate portion, care is taken so that the flowing direction is parallel with the optical axis direction of the fiber. Thereby, the ferrule is prevented from being deviated in position due to the molding pressure to secure the processing accuracy of a receptacle portion (i.e., accuracy of connection with a connector).

Figure 3A:
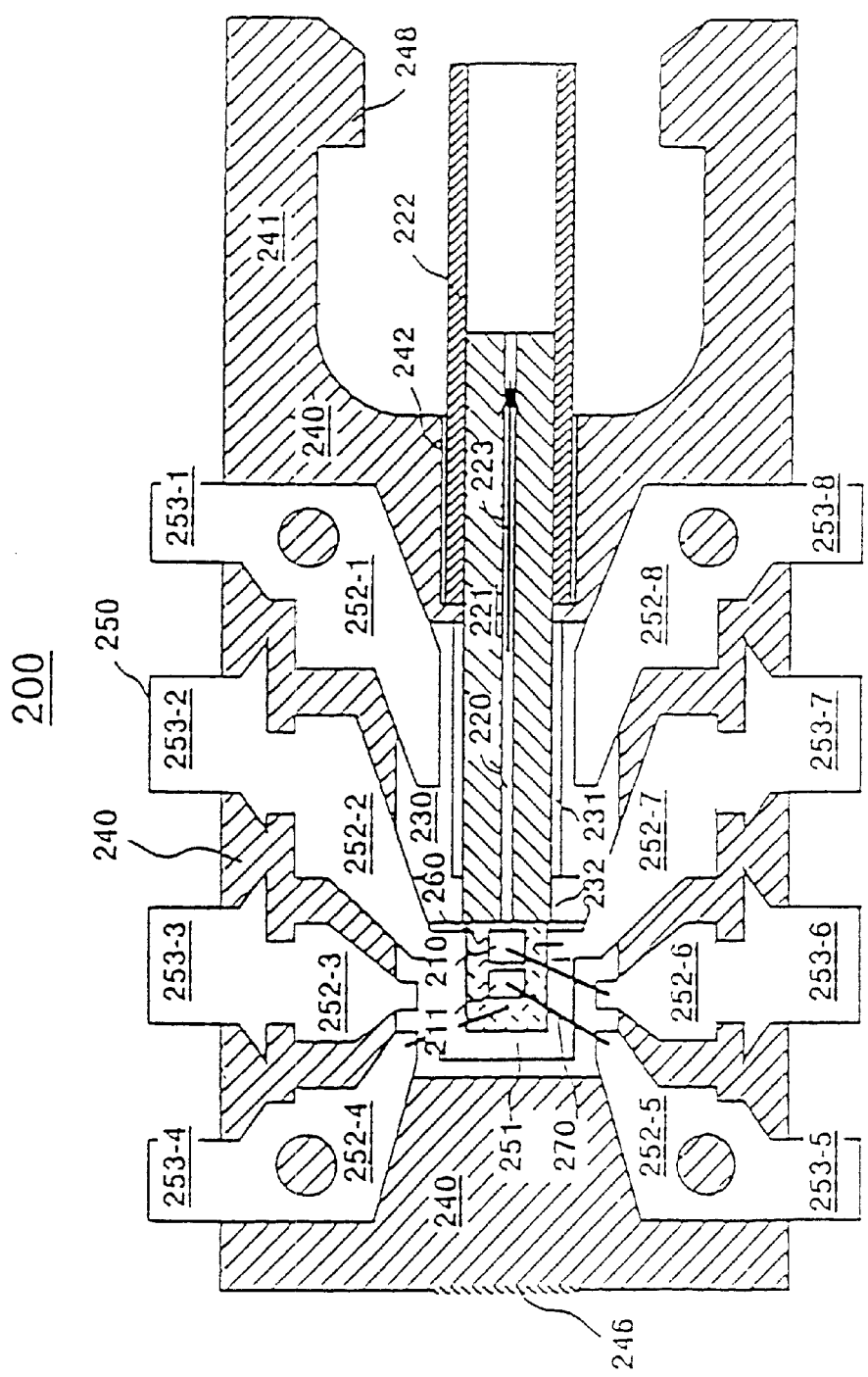
FIG. 3A is a plan view of assistance in explaining the receptacle type optical module according to a third embodiment of the present invention.
Figure 3B:
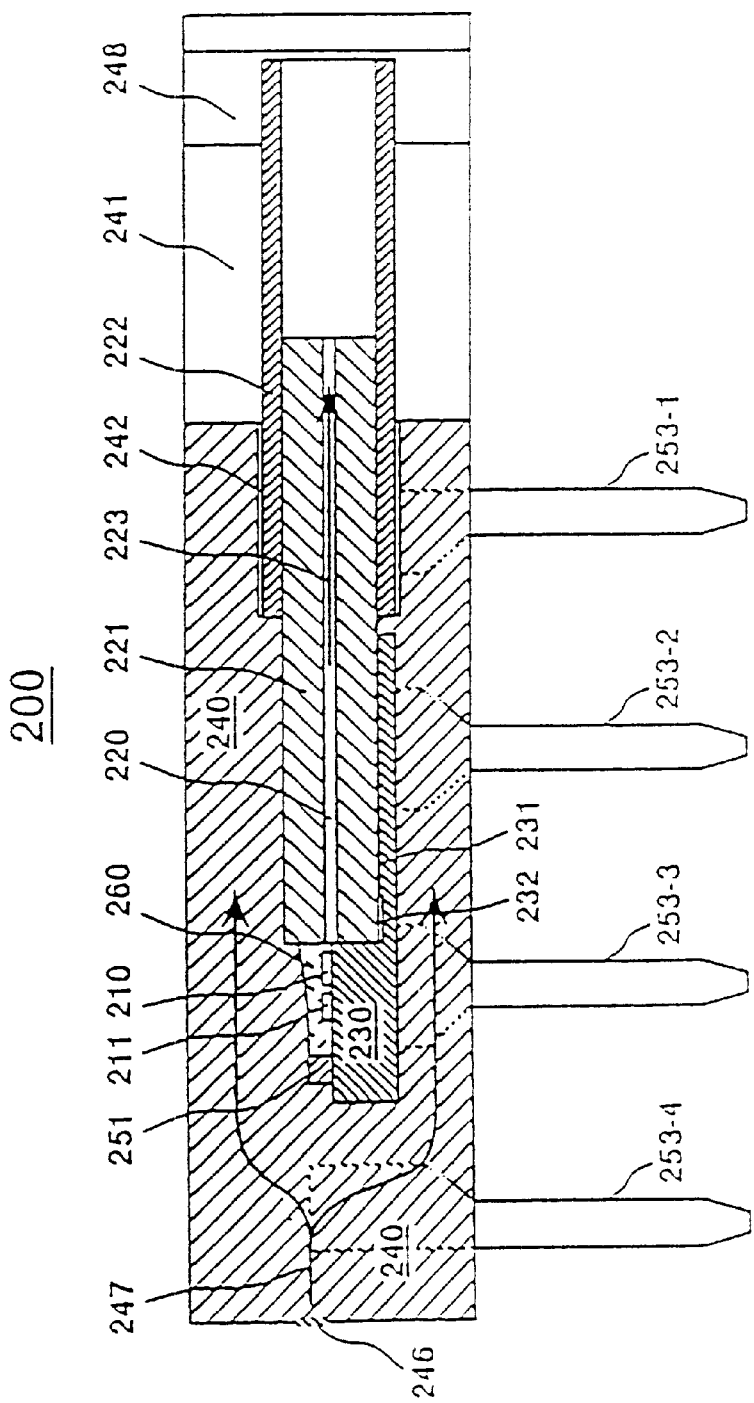
FIG. 3B is a sectional view in the direction parallel to the optical axis of assistance in explaining the receptacle type optical module according to the third embodiment of the present invention.

The third embodiment of the present invention will be described hereinafter with reference to FIGS. 3A and 3B. FIG. 3A is a partial plan view as viewed from the top, and FIG. 3B is a partial sectional view as viewed from the side. FIGS. 3A and 3B show a receptacle type optical transmission module by way of a package formed by a comprehensive molding method.

As shown in FIGS. 3A and 3B, an optical module 200 comprises optical devices 210, 211, an optical fiber 220, a substrate 230, a comprehensive molding type plastic package 240, and a lead frame 250.

The optical devices 210, 211 are subjected to die bonding to the substrate 230. The extreme end of a ferrule 221 encasing therein an optical bare fiber 220 is fixedly secured to a V groove 231 provided in the substrate 230, and runs into the side of a recessed groove 232 likewise provided in the substrate 230. The optical device 210 and the fiber 220, and the optical device 210 and the optical device 211 are optically coupled with each other. The extreme ends of inner leads 252-1 to 8 of the lead frame 250 are fixedly secured to the surface of the substrate 230. Of outer leads 253-1 to 8, 253-4 to 7 are electrically connected to the optical devices 210, 211 through inner leads 252-4 to 7 and a wire 270. The outer leads 253-2 and 253-7 are connected to each other through a bus bar 251.

The surfaces of the optical devices 210 and 211 and the side of the fiber 220 are encapsulated by a transparent resin 260. A receptacle portion 241 of the package 240 is provided with a latch 248 and a recessed portion 242. At the rear end of the ferrule 221 projecting from the recessed portion 242, a sleeve 222 is fitted.

The specifications of the optical devices 210, 211, the fiber 220, the substrate 230, the lead frame 250 and the package 240 generally correspond to the components used in the first or the second embodiment.

The third embodiment is different from the first or the second embodiment in the following various points: (1) The receptacle portion 241 is provided on the package 240. (2) In the receptacle portion 241, the fiber 220 is supported by the ferrule 221 in order to connect an optical connector. (3) The ferrule 221 is supported by the V groove 231 and the recessed groove 232 in consideration of the force for inserting and removing a connector applied to the receptacle portion 241. (4) The construction of the package 240 is possibly symmetrical in all directions to arrange the lead frame 250 on the base plate 230 in consideration of the same as that just mentioned above. (5) With respect to the electric characteristics, the load capacitance of the optical devices 210, 211 (floating capacity of the substrate 230) is reduced, and the inductance of the lead frame 250 is reduced by the bus bar 251.

Materials for the ferrule 221 comprise zirconia ceramic, glass or plastic, which is selected according to the specifications of the connector loss and the times of connections. The outside diameter is for example, 0.99 mm, and the inside diameter (the diameter of a through-hole into which the fiber 220 is inserted) is for example, 126 $\mu$m. The end surface of the ferrule 221 on the receptacle portion 241 side is polished in order to connect a connector. A sleeve is formed of zirconia ceramic or plastic. When a connector is connected to the receptacle portion 241, the connector is mechanically gripped by a latch 248, and a ferrule on the connector side is inserted into a sleeve 222 so that said ferrule comes in close contact with the ferrule 221.

The width of the V groove 231 of the substrate 230 is for example, 1201 $\mu$m, which is considerably wide as compared with the V grooves 31, 131 in the first and the second embodiments. Because of this, a half-value total angle of a far field pattern of the optical device 210 is narrowed down to 20×25° (approximately 1.4×1.1 $\mu$m in spot size) taking the etching accuracy of the V groove 231, the outside and inside diameter-accuracy of the ferrule 221 into consideration. The recessed groove 232 functions as a stopper of the ferrule 221, an dicing process is applied so that a spacing between the forward end of the optical device 210 and the end of the ferrule 221 assumes a predetermined distance.

The length of the package 240 is 14 mm including the receptacle portion 241, the width is 6.3 mm, and the height is 3 mm. As a molding material for the package 240, an epoxy resin material having an adequate elastic modulus is used so that the latch 248 of the receptacle portion 241 may be a spring function.

In transfer molding of the package 240, care is taken so that the resin is flown in the direction of arrow 247 from the gate portion 246 so as to make the flowing direction 247 parallel with the optical axis direction 223 of the fiber 220. Thereby, the ferrule 221 is prevented from being deviated in position due to the molding pressure to secure the processing accuracy of the receptacle portion 241 (that is, the connecting accuracy with the connector). Since the optical devices 210, 211 is surrounded by the bus bar 251 and covered by the transparent resin 260, the molding pressure is not applied directly thereto. The bus bar 251 functions as a flow-stop dam when the transparent resin 260 drops, and has the effect of preventing the transparent resin 260 from being deformed by the molding pressure.

The receptacle type module shown in the third embodiment is advantageous for automation when the module is mounted on a print wiring substrate or the like. This is because the pigtail fiber need not be handled, as compared with the pigtail type module as in the first embodiment and the second embodiment.

Embodiment 4

The fourth embodiment comprises an example of a resin case type package. For molding the resin case, an injection molding is employed. For sealing optical devices and an optical fiber, a potting method using a low elastic resin is used. In the injection molding, the flowing of resin from a gate portion is in the optical axis direction of the fiber. Accordingly, since the rigidity of the package is enhanced, and the thermal expansion and thermal shrinkage are reduced in that direction, the thermal stress from the outside applied to the fiber and ferrule can be suppressed.

Figure 4A:
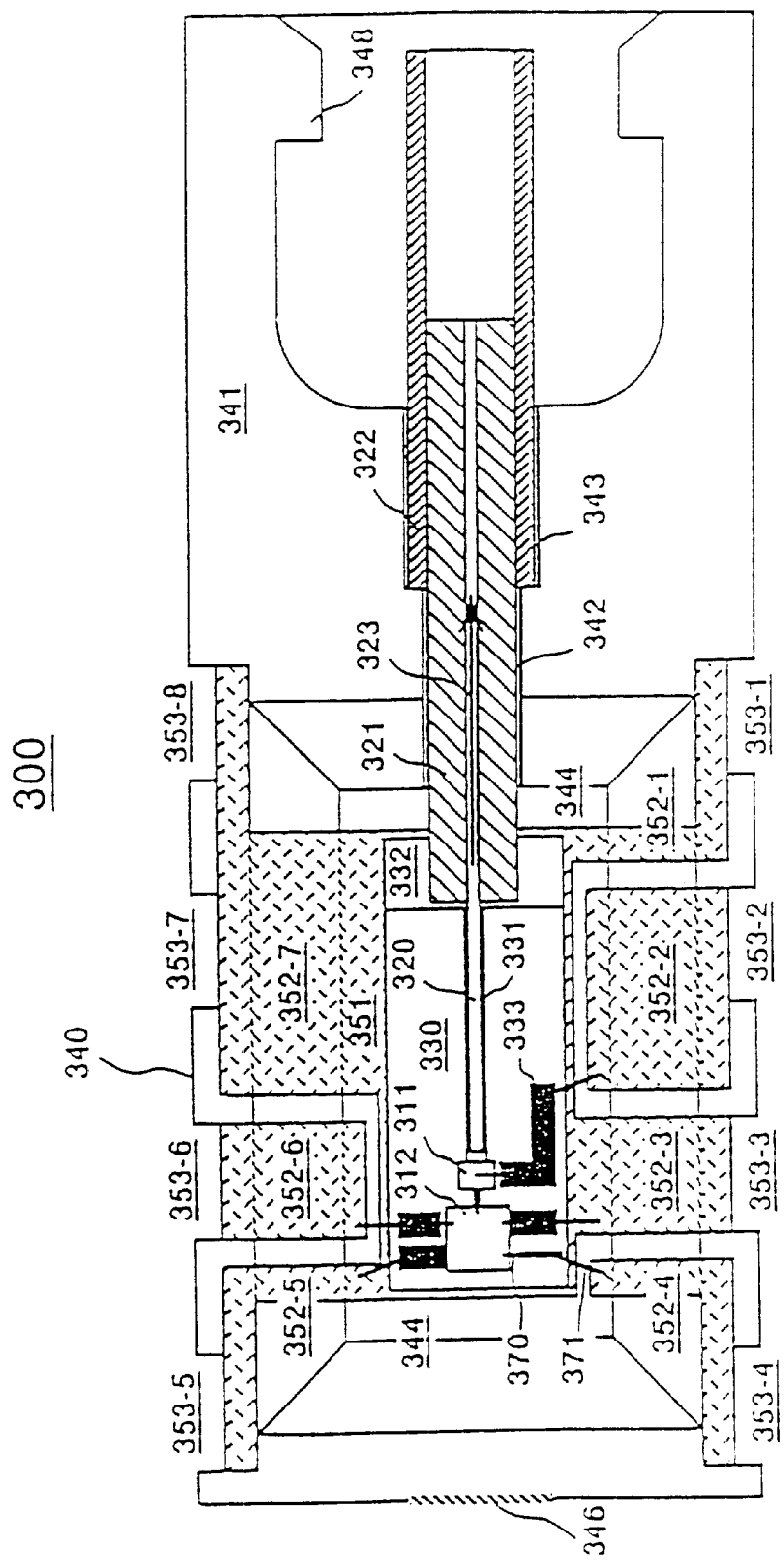
FIG. 4A is a plan view of assistance in explaining the receptacle type optical module according to a fourth embodiment of the present invention.
Figure 4B:
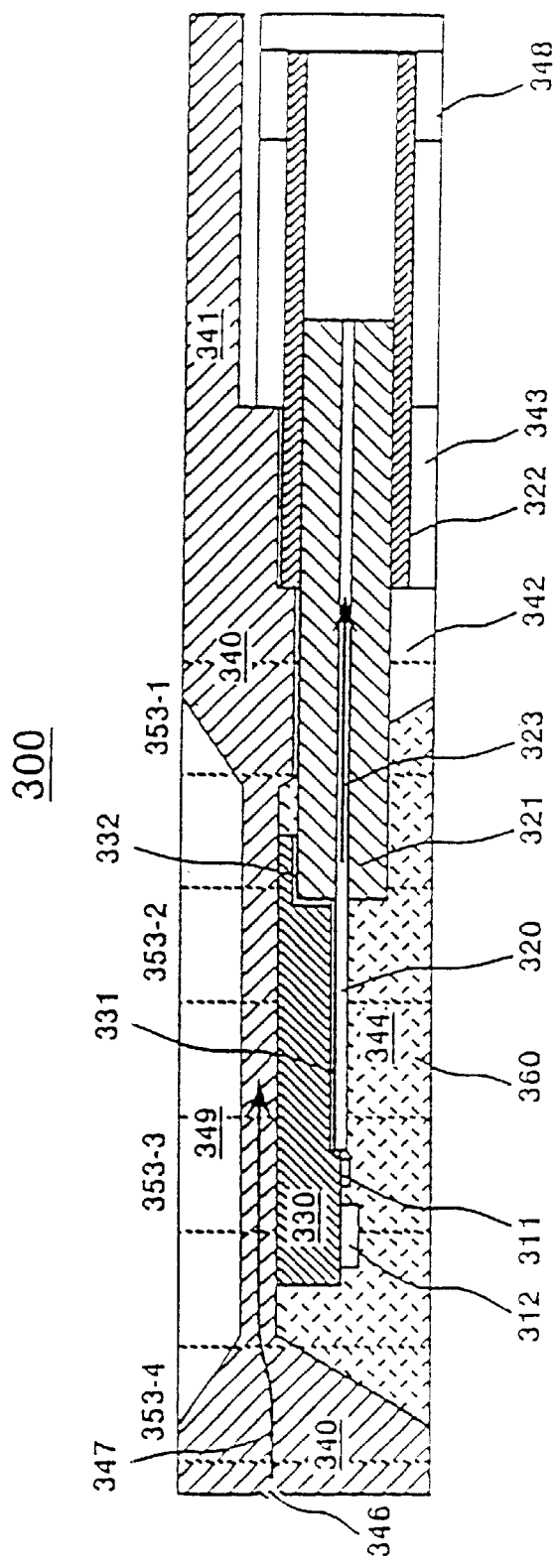
FIG. 4B is a sectional view in the direction parallel to the optical axis of assistance in explaining the receptacle type optical module according to the fourth embodiment of the present invention.

The fourth embodiment of the present invention will be described hereinafter with reference to FIGS. 4A and 4B. FIGS. 4A and 4B show a receptacle type light receiving module by way of a resin case type package. FIG. 4A is a partial plan view as viewed from the bottom, and FIG. 4B is a partial sectional view as viewed from the side.

As shown in FIGS. 4A and 4B, a package 340 encases therein an optical device 311, an IC device 312, a fiber 320, and a substrate 330, which are sealed by potting of a transparent resin 360.

The optical device 311 and the IC device 312 are subjected to die bonding to the substrate 330. The extreme end of the bare fiber 320 is fixedly secured to a V groove 331 provided in the substrate 330, and the optical device 311 and the optical fiber 320 are optically coupled. The rear portion of the optical fiber 320 is supported by a ferrule 321. The ferrule 321 is fixedly secured to a recessed groove 332 of the base plate 320 and a U groove 342 of the package 340. A receptacle portion 341 of the package 340 is provided with a latch 348 and a U groove 343, and a sleeve 322 is fitted to the ferrule 321 at the U groove 343.

A die pad 351 and wirings 352-1 to 7 are plated on the surface of a cavity 344 in the lower surface of the package 340, terminals 353-1 to 8 are plated on the recessed portion of the side, and the surface of an upper cavity 349 is also plated. Ground terminals 353-1, 3, 5, 7 and 8 are connected to the die pad 351 and the wirings 352-1, 3, 5 and 7. A power terminal 352-2, a signal terminal 352-4, and a power terminal 352-6 are connected to a bias electrode of the optical device 311, a signal electrode of the IC device 312, and a power electrode of the IC device 312, respectively, through a wiring 333 and wires 370, 371 formed on the substrate 330.

The optical device 311 comprises a photodiode, and the IC device 312 comprises a receiving circuit including a pre-amplifier for amplifying a photo current signal of the optical device 311. The specification of t he fiber 320, the ferrule 321, the sleeve 322, and the substrate 330 corresponds to that described in the first to the third embodiments.

The fourth embodiment is different from the third embodiment in the following points:

(1) The package 340 is a resin case having the cavities 344, 349 in both upper and lower surfaces thereof.

(2) The wirings 352-1 to 7 and the terminals 353-1 to 8 are plated to thereby omit the lead frames (which teaches to be LCC type).

(3) The bare fiber 320 is fixedly secured to the V groove 331, and the ferrule 321 is fixedly secured to the recessed groove 332 and the U groove 342 in consideration of the force for inserting and removing the optical connector with respect to the receptacle portion 341 and the thermal stress of the package 340.

The sizes of the module 300, that is, the package 340 are as follows: The length is 16.5 mm (including the receptacle portion 341), the width is 6.3 mm, and the height is 2.8 mm. The module 300 is mounted on a separate construction (for example, such as a printed board, a housing, etc.) with the back of the substrate 330 directed upward. Since a part of the separate construction can be used as a cap, the number of parts can be reduced, and the module 300 can be made to be a thin type as compared with the first embodiment.

The terminals 353-1 to 8 are excellent in high frequency characteristic since they are short as compared with the lead frames as in the first to the third embodiment. Further, with respect to the wirings formed on the surface of the cavity 349, electromagnetic noises can be shielded by the ground wirings. Further, a bypass capacitor is connected between the ground wiring and the power wiring whereby a power supply can be stabilized. The photodiode mounted on the receiving module doesn't cause a problem of heat dissipation, but in the case where a laser diode or the like is mounted in place of the optical device 311 in the fourth embodiment, a heat sink or radiation fins may be mounted on the cavity 349.

The package 340 is obtained by injection-molding a liquid crystal polymer, and forming a Cu or Au plating pattern on the surface thereof. In the injection molding, the resin is caused to flow in the direction of arrow 347 from a gate portion 346. Thereby, the rigidity of the package 340 is enhanced in the optical axis direction 323 of the fiber 320, and the thermal expansion and the thermal shrinkage are reduced, thus enabling the suppression of the thermal stress from the outside applied to the fiber 320 or the ferrule 321. Since the rigidity of a latch 348 can be secured, no snapping (breakage) due to the repetition of connector connection to the receptacle 341 occurs.

For the transparent resin 360 for coating the optical device 311, the IC device 312, and the bare fiber 320, silicone rubber harder than the silicone gel as in the first embodiment is used. This is because the transparent resin also serves as a sheathing material for the lower surface of the package 340. In the case where a stray light entering the optical device 311 through the transparent resin 360 poses a problem, the surface of the transparent resin 360 may be colored, or a black over-coating may be applied.

While the optical modules in the first to the fourth embodiments according to the present invention have been described, it is to be noted that the most important point of the present invention is that irrespective of the fact that the plastic package is the resin case type or the comprehensive molding type, the flowing direction of the mold resin is parallel with the optical axis of the fiber. Thereby, it is possible to realize the lower cost and higher reliability relative to the optical device and the optical fiber peculiar to the optical module.

Embodiment 5

In the present embodiment, an example of a card type optical module will be explained, in which a resin case type is used for a method of manufacturing a resin case member.

Figure 5:
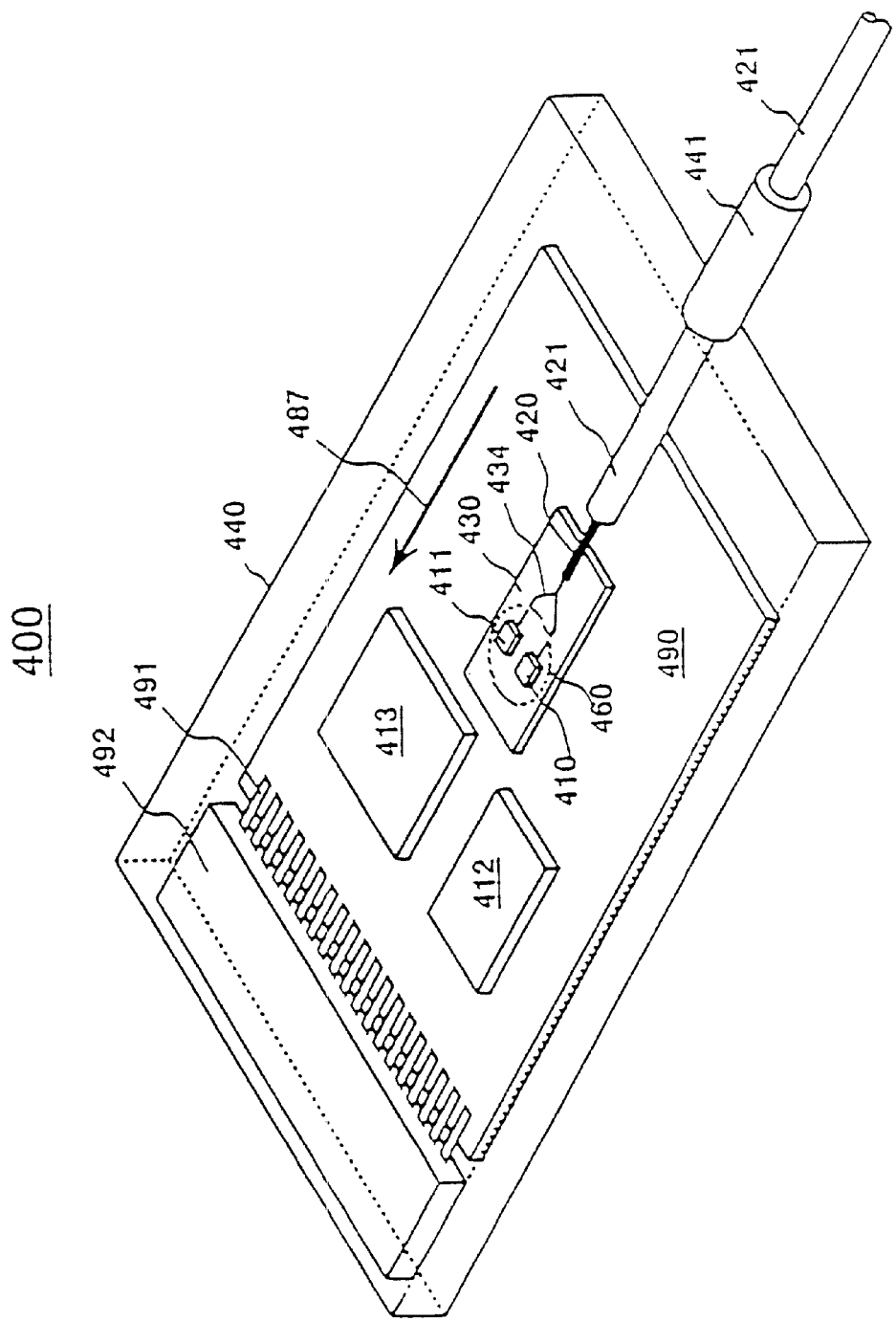
FIG. 5 is a perspective view of assistance in explaining the card type optical module according to a fifth embodiment of the present invention.

FIG. 5 is a perspective view showing an example of the card type optical module. In a base 440 of the resin case member for supporting the whole optical module are mounted module elements and connecting portions with respect to an electric system. An optical communication system, a photoelectric conversion element portion and a driving integrated circuit portion thereof are arranged in the card type on a substrate 430.

Mounted components corresponding to the card type as described above has the constitution and characteristics basically similar to those shown previously except employment of the form provided for the card type.

An optical light emitting device 410 (for example, a laser diode) and an optical light receiving device 411 (for example, a photodiode) are subjected to bonding to the mounted substrate 430, which are optically coupled by a bare fiber 420 and an optical branch waveguide portion 434. The bare fiber 420 is covered with a jacket 421. The jacket 421 is supported by a fiber holder 441. These optical light receiving devices 410, 411 are covered with the transparent resin 460. It is noted that FIG. 5 shows only the plane area covering the transparent resin. A semiconductor integrated circuit device 412 comprises a driving circuit of the light receiving device 410, and a semiconductor integrated circuit device 413 comprises a light receiving circuit including a pre-amplifier for amplifying a photocurrent from the light receiving device 411. The respective semiconductor integrated circuit devices 412, 413 are mounted on a printed board 490 and connected to an external electric signal circuit by means of an electric connecting terminal 491 and a connector 492. The printed board 490 and the connector 492 are embedded in a base 440 (which includes also a fiber holder 441) for the resin case member. Although omitted in FIG. 5, a cap of the card type of the resin case member is prepared to cover the base 440.

The method for manufacturing a resin case member is a "resin case type", which is basically similar to the first embodiment. The base 440 of the resin case member and the cap are formed of a liquid crystal polymer of a glass fiber-reinforced grade of a thermoplastic resin. The flowing direction in molding thereof is substantially parallely with the optical axis direction of the optical fiber. In this manner, a molecular chain of the liquid crystal polymer is oriented substantially parallel with the optical axis direction of the optical fiber. Thereby, it is possible to enhance the elastic modulus in the direction of the base 440 of the resin case member and the cap and to reduce the coefficient of thermal expansion. Normally, the tensile stress in the optical axis direction or the bending stress is applied particularly to the fiber holder portion. However, in the present embodiment, the sufficient mechanical strength can be secured, and the external stress applied to the optical fiber 421 can be suppressed.

Needless to say, the methods mentioned in the embodiments 1 to 4 can be applied to the manufacturing of the card type optical module.

Embodiment 6

Figure 6:
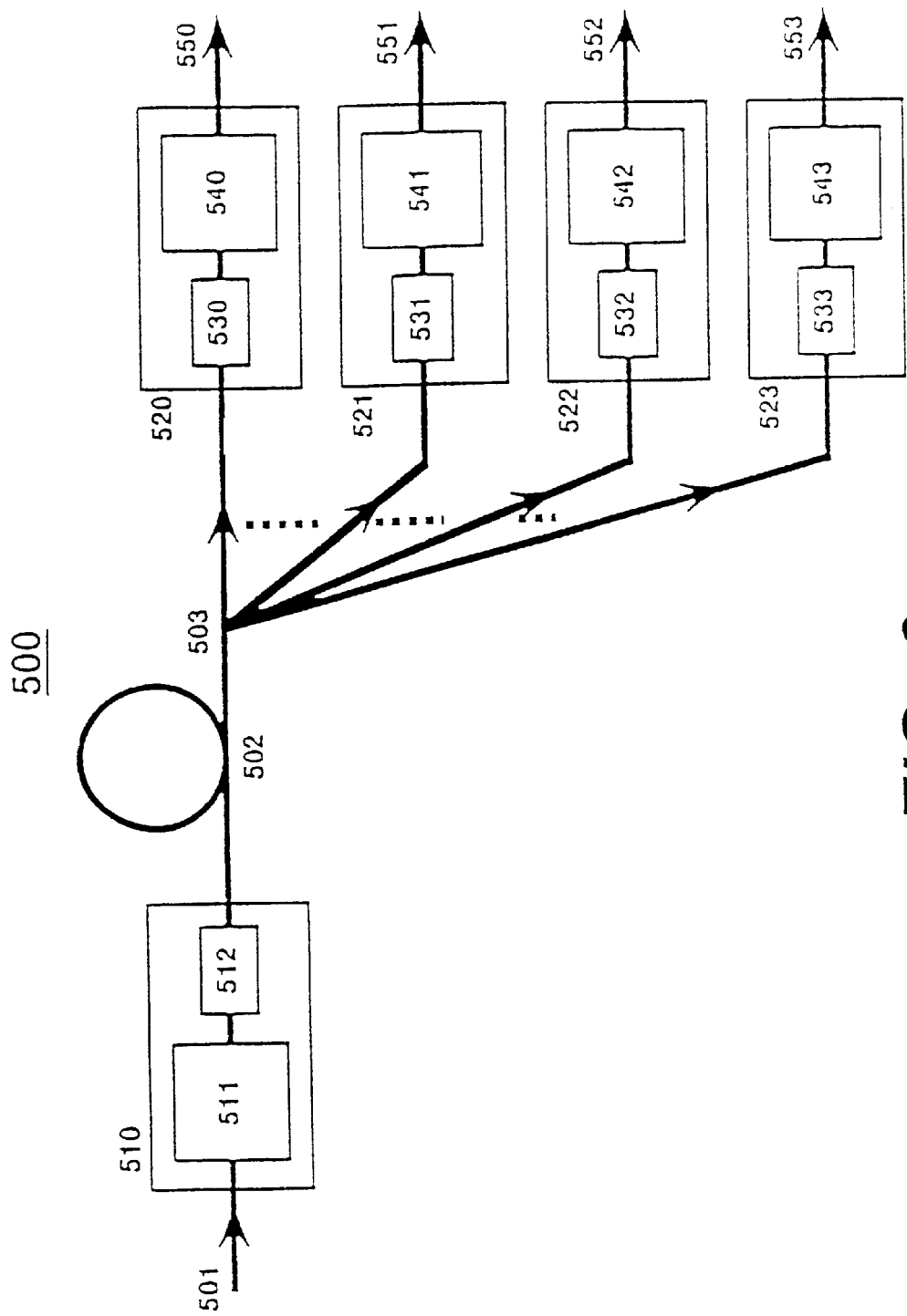
FIG. 6 is a view of assistance in explaining the optical communication system according to the present invention.

In the present embodiment, a typical example of the optical communication system will be explained. FIG. 6 is a view showing the typical example of the optical communication system. In an optical communication system 500, reference numeral 501 designates a server; 510 a transmission device; 502 an optical fiber; 503 an optical distributor; 520 to 523, respectively receiving devices; and 550 to 553, respectively transmissions to terminals. Information from the server 501 is transmitted to a plurality of terminals by the optical distributor 503. It is noted that the transmission device 510 mainly comprises a transmission LSI (integrated circuit device) portion 511, and an optical transmission module 512 for converting an electric signal into light to transmit it. On the other hand, each of the receiving devices 520 to 523 mainly comprises optical receiving modules 530 to 533, and receiving LSI (integrated circuit device) portions 540 to 543 for photoelectric converting light therefrom. The respective communication devices according to the present invention are concerned with the constitution of a transmission device or receiving device.

As the optical transmission module or the optical receiving module, the optical module illustrated in the embodiment 1 was used. The optical modules illustrated in the embodiments 2 to 4 can be also used.

As described above, according to the present invention, it is possible to provide an optical communication system which has a high reliability and is inexpensive.

INDUSTRIAL APPLICABILITY

The present invention can be used for a resin mold type optical module and an optical fiber communication apparatus particularly using the resin mold type optical module. Further, the present invention can be applied to an optical communication system.

What is claimed is:

1. An optical module comprising:
   an optical device;
   an optical fiber optically coupled to said optical device; and
   a base and a cap for a resin case member having at least said optical device and said optical fiber mounted thereon,
   wherein said base and said cap form a cavity, and at least said optical device and said optical fiber are set in the cavity, and said cavity contains gel with which at least a portion of coupling between said optical device and said optical fiber is covered.

2. An optical module according to claim 1, wherein said optical device and at least a portion of said optical fiber are encapsulated with a transparent resin.

3. An optical module according to claim 2, wherein said transparent resin comprises a thermosetting resin.

4. An optical module according to claim 2, wherein said optical device and a part of said optical fiber is encapsulated on a predetermined member with said transparent resin.

5. An optical module according to claim 1, wherein said base and said cap are formed by an injection method using pressure.

6. A method for manufacturing an optical module comprising an optical device and an optical fiber optically coupled to said optical device, comprising the steps of:
   forming a base and a cap for a resin case member by an injection method using pressure to form a cavity;

solidifying said resin to package a part of said optical device and at least a portion of said optical fiber in said cavity; and putting gel into said cavity so that a portion of coupling between said optical device and said optical fiber is covered with said gel.

7. A method for manufacturing an optical module according to claim 6, wherein said optical device and the portion of said optical fiber is casted on a predetermined member with a transparent resin, and said resin is solidified and packaged, including at least said predetermined member.

8. A method for manufacturing an optical module comprising the steps of:

preparing at least an optical device, an optical fiber optically coupled to said optical device, a substrate having said optical device and said optical fiber mounted thereon, and a lead frame electrically connected to said optical device; and forming a base and a cap for a resin case member by an injection method using pressure, said base and said cap forming a cavity and at least said optical device and said optical fiber being to be set in the cavity;

solidifying said resin to package a part of said optical device and at least a portion of said optical fiber in said cavity; and putting gel into said cavity so that the portion of coupling between said optical device and said optical fiber is covered with said gel.

9. A method for manufacturing an optical module according to claim 8, wherein the step of forming said base and said cap is made to effect transfer molding with inserting said substrate and said lead frame.

* * * * *